(12) United States Patent
Fujimoto et al.

(10) Patent No.: US 6,391,111 B1
(45) Date of Patent: May 21, 2002

(54) COATING APPARATUS

(75) Inventors: Akihiro Fujimoto, Kumamoto-ken; Kazuo Sakamoto; Nobukazu Ishizaka, both of Kumamoto; Izumi Hasegawa, Kumamoto-ken, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/231,659

(22) Filed: Jan. 15, 1999

(51) Int. Cl.[7] .......................... B05B 13/02; B05B 1/30; B05C 11/00; B05C 11/10; B67D 5/34
(52) U.S. Cl. .................... 118/321; 118/320; 118/679; 118/684; 118/685; 118/699; 118/710; 239/68; 239/71; 239/119; 222/71; 222/108; 222/571
(58) Field of Search ................................. 118/679, 682, 118/683, 684, 685, 688, 692, 619, 710, 704, 320, 321; 239/68, 71; 222/571, 108, 71; 234/119

(56) References Cited

U.S. PATENT DOCUMENTS

| | | | | |
|---|---|---|---|---|
| 5,134,962 A | * | 8/1992 | Amada et al. | 118/688 |
| 5,405,443 A | * | 4/1995 | Akimoto et al. | 118/668 |
| 5,985,357 A | * | 11/1999 | Sanada et al. | 427/8 |
| 6,010,740 A | * | 1/2000 | Rutledge | 427/8 |
| 6,056,998 A | * | 5/2000 | Fujimoto | 427/240 |
| 6,062,442 A | * | 5/2000 | Yang et al. | 222/571 |

FOREIGN PATENT DOCUMENTS

| | | |
|---|---|---|
| JP | 63-236559 | 10/1988 |
| JP | 63-250124 | 10/1988 |
| JP | 2-156627 | 6/1990 |
| JP | 04-352316 | 12/1992 |
| JP | 09-253564 | 9/1997 |
| JP | 11-026377 | 1/1999 |

* cited by examiner

Primary Examiner—Richard Crispino
Assistant Examiner—J. A. Lorengo
(74) Attorney, Agent, or Firm—Rader, Fishman & Grauer

(57) ABSTRACT

To provide a coating apparatus which is capable of making short a lag time up to action of a valve and making operate a discharging pump and a valve with the best timing. By employing electric-air regulators ER1 and ER2 of small size and high response speed as a speed controller for controlling a switching speed of a switching valve AV or a suck-back valve SV, total flowing course is made short, thereby a time lag up to operation of a valve is made short. Further, by detecting the pressure of a resist liquid being discharged from a discharging pump 120 by a pressure sensor 123, and by controlling the operation of each device of a discharging pump 120, a switching valve AV, and a suck-back valve SV through a controller 180, a discharging pump 120, a switching valve AV, and a suck-back valve SV can be operated with the best timings, and generation of particles due to dripping of a resist liquid at a tip end of a resist nozzle 60 is prevented from occurring.

5 Claims, 21 Drawing Sheets

A-A

B-B

COATING APPARATUS

BACKGROUND OF THE INVENTION

1. Field of the Invention

The present invention relates to a coating apparatus for coating a coating liquid such as a resist liquid onto a surface of an object to be treated such as a semiconductor wafer or the like.

2. Description of the Related Art

In the photolithography step for instance, in the manufacturing process of a semiconductor device, for instance, the resist coating treatment for forming a resist film on a surface of a semiconductor wafer (hereinafter refers to as "wafer") is carried out, after an exposing treatment is carried out to the wafer thereon the resist is coated, a developing treatment is carried out.

FIG. 22 is a diagram showing diagrammatically a constitution of a resist liquid supply system of a conventional resist coating apparatus.

When an attention is paid to a device for coating a resist, in the conventional coating apparatus, as shown in FIG. 22, a resist liquid stored in a resist tank 201 is pumped out by a supplying pump 202 and stored in a buffer tank 203 once, then the resist liquid stored in the buffer tank 203 is sent by pressure towards a nozzle 205 by a discharging pump 204, and by switching the flowing course of the resist liquid by a valve 206 disposed between the discharging pump 204 and the nozzle 205, the timing of discharge of the resist liquid from the nozzle 205 is controlled.

The valve 206 employed here is an air operation valve which is driven through a compressed air and is provided with a structure in which the flowing courses on the sucking side and the discharging side are opened or closed therebetween by a cylinder operated by the compressed air, and switching of flowing in/stoppage of the compressed air is carried out by a solenoid valve 207 disposed between an air compressor which sends the compressed air and the valve 206. This solenoid valve 207 has a structure that the solenoid is driven based on the electrical signals from a controller 208 to open or close the flowing course of the compressed air.

Further, the switching speed of the valve 206 is controlled by a speed controller 209 disposed between the solenoid valve 207 and the valve 206. This speed controller 209 has a structure in which the width of the flowing course of the compressed air is adjusted by an amount of projection of a needle and the amount of projection of the needle is adjusted manually.

Incidentally, in order to form a resist film of excellent quality on a wafer, a predetermined amount of a resist liquid is dripped on an wafer revolving with a high speed and diffused due to a centrifugal force over the whole wafer, at the same time, the superfluous resist liquid is required to be removed from on the wafer. Therefore, rotation of the wafer, the discharging pump 204 and the valve 206 are required to be operated with the predetermined timings.

However, in the aforementioned conventional coating apparatus, there tends to occur a time lag between from the sending of the operational signal from the controller 208 up to the actual switching operation of the valve 206.

This time lag is adjusted by use of the speed controller 209. However, it varied due to the length of the flowing course or the individual difference of the valves themselves, accordingly the adjustment thereof is very difficult. Therefore, there was a problem that the timing of the discharge of the resist liquid deviated against the revolution of the wafer to induce occurrence of films of bad quality such as the films of the fluctuated thickness.

In addition, as shown in FIG. 22, in the case of the resist tank 201 being disposed below the floor, a buffer tank 203 is required to be disposed between from the resist tank 201 to the discharging tank 204. However, when the buffer tank 203 is disposed, accompanying this, a liquid level sensor 211 becomes necessary. There occur such problems that it leads to the rise of the cost or larger size of foot print, and, due to an increase of the surface area which makes a contact with the air, the resist liquid tends to deteriorate.

SUMMARY OF THE INVENTION

The present invention was made to solve such problems as described above, an objective of the present invention is to provide a coating apparatus which can make as short as possible the time lag up to operation of the valve.

Another objective of the present invention is to provide a coating apparatus in which the discharging pump and the valve can be operated with the best timings.

Still another objective of the present invention is to provide a coating apparatus in which a switching valve and a suck back valve can be operated at the best timing.

The still another objective of the present invention is to provide a coating apparatus in which the rise of the cost and deterioration of the resist liquid can be prevented from occurring.

The coating apparatus of the present invention comprises a nozzle discharging a coating liquid to an object to be treated, a container for storing the coating liquid, a discharging pump which is disposed between the nozzle and the container and sends out the coating liquid in the container to the nozzle, a speed controlling means, disposed between the discharging pump and the nozzle, of controlling electrically the switching speed, and a controlling means for controlling the operation of the discharging pump.

The aforementioned coating apparatus, in which the valve is consisting of a switching valve and a suck back valve, may be provided with a controller exclusively controlling the operation of the switching valve and the suck back valve.

Further, the aforementioned coating apparatus may be further provided with a pressure detecting means for detecting the pressure of the coating liquid on the downstream side of the discharging pump, and the controlling means may be a means which controls the operation of the valve based on the detected pressure of the coating liquid.

Further, the coating apparatus, which is disposed between the container and the discharging pump, may be further provided with a supplying pump for supplying the coating liquid in the container to the discharging pump, and a pressure controlling means for controlling the pressure of the coating liquid of the down stream side of the supplying pump, wherein the controlling means may be a means for controlling the pressure of the supplying pump based on the operation of the discharging pump.

Further, the controlling means may be a means for controlling the pressure of the supplying pump and the timing of the operation of the valve based on the actions of the discharging pump.

The aforementioned device may further comprise a means for detecting the pressure of the coating liquid of the down stream side of the discharging pump, a supplying pump, which is disposed between the container and the discharging pump, for supplying the coating liquid in the container to the discharging pump, and, a means for controlling the pressure of the coating liquid of the down stream side of the supplying pump, wherein the controlling means may be a means which, based on the pressure detected by the pressure detecting means, controls the actions of the discharging pump and the valve, and at the same time, controls the pressure of the supplying pump based on the actions of the discharging pump.

DESCRIPTION OF THE PREFERRED EMBODIMENTS

In the following, the detail of the embodiment of the present invention will be described with reference to the drawings.

Incidentally, it should not be construed that the scope of the present invention is restricted to the range of the following embodiments.

Figure 1:
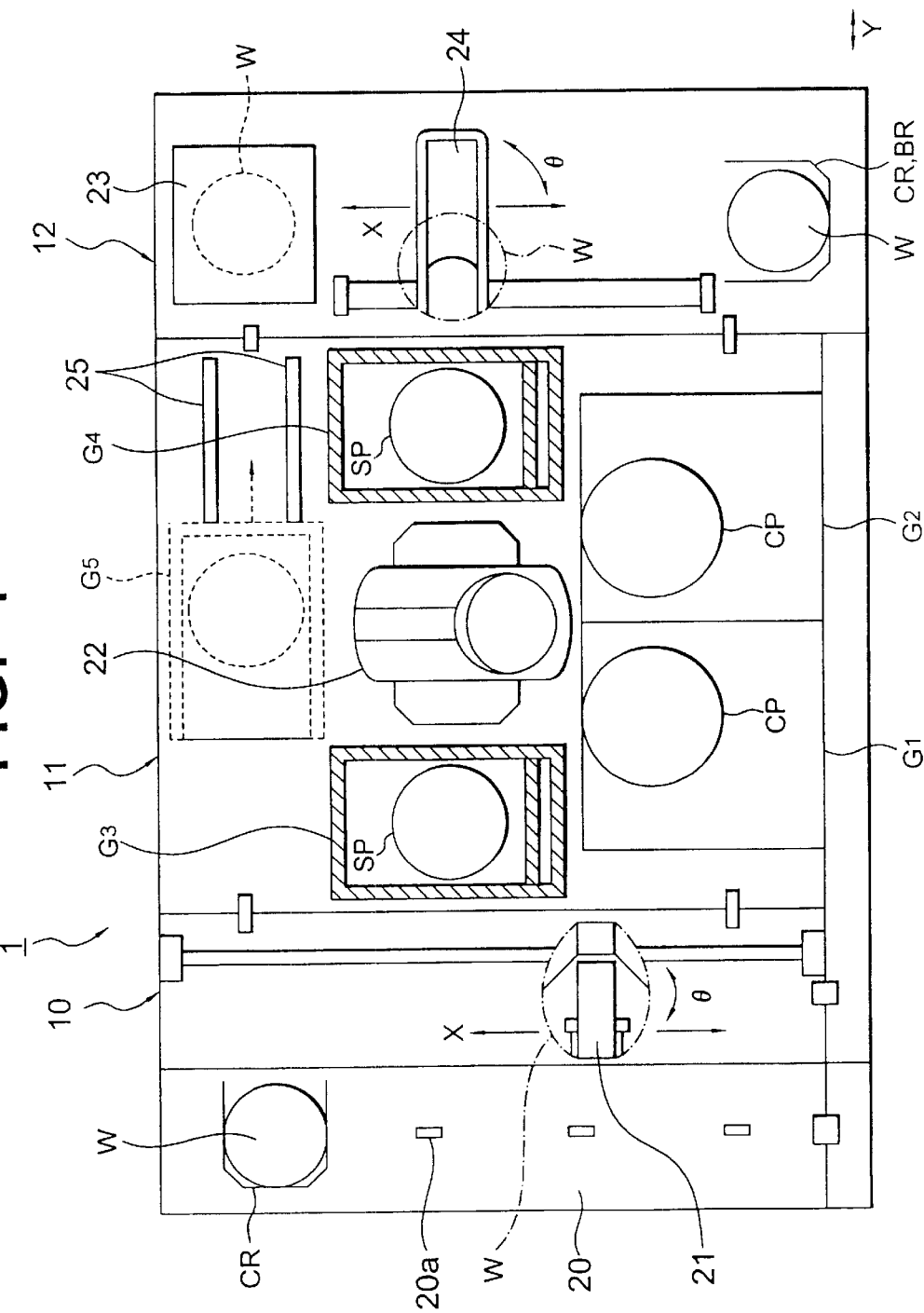
FIG. 1 is a plan view of a coating/developing treatment system provided with a resist coating unit involving one embodiment of the present invention.

FIG. 1 is a plan view showing a whole coating/developing treatment system 1 of a semiconductor wafer (hereinafter refers to as "wafer") provided with a resist coating unit (COT) involving one embodiment of the present invention.

In this coating/developing treatment system 1, a cassette station 10 where wafers W, as the object to be treated, are carried in/out from outside the system by a plurality of sheets, for instance, by a unit of 25 sheets, by an wafer cassette CR, a treatment station 11 where various kinds of treatment units of sheet-fed type, which give the predetermined treatments to the wafers one by one in the coating/developing process, are disposed multistage at the predetermined positions, and an interface portion 12 where the wafers are delivered between an exposing device (not shown in the figure) disposed adjacent to the treatment station 11 are connected integrally.

In this cassette station 10, on the positions of aligning projections 20a on the cassette stage 20, a plurality of number, for instance up to 4 pieces, of the wafer cassettes CR, are placed in one line of X direction (up and down direction in FIG. 1) with each inlet/outlet of the wafer directed toward the treatment station 11 side, and an wafer carrier 21 capable of moving in this cassette alignment direction (X direction) and in the wafer alignment direction (Z direction; vertical direction) of the wafers W accommodated in the wafer cassette CR can make a selective access to each wafer cassette CR.

This wafer carrier 21 is capable of revolving freely in θ direction and can also make an access to an alignment unit (ALIM) disposed in a multistage unit portion of the third treatment unit group $G_3$ on the treatment station 11 side or an extension unit (EXT).

In the treatment station 11, a main wafer carrying system 22 of vertically carrying type provided with an wafer carrying device is disposed, and on the surroundings thereof, the whole treatment units are disposed multistage in one pair or in a plurality of pairs.

Figure 2:
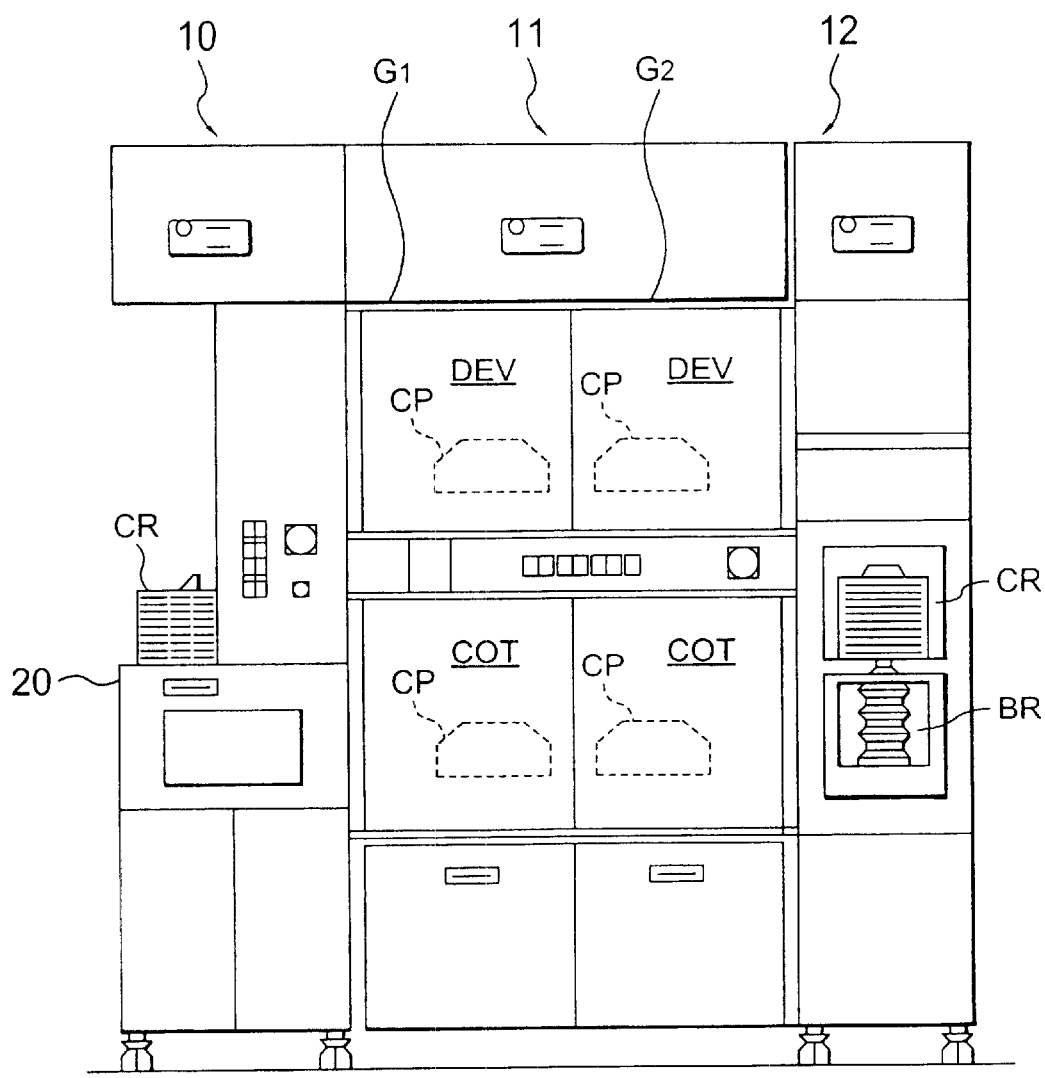
FIG. 2 is a front view of a coating/developing treatment system provided with a resist coating unit involving one embodiment of the present invention.

FIG. 2 is a front view of the aforementioned coating/developing treatment system 1.

In the first treatment unit group $G_1$, two sets of spinner type treatment unit of carrying out the predetermined treatment with a wafer W placed on a spin chuck in a cup CP, for instance, a resist coating unit (COT) and a developing unit (DEV), are stacked in turn in two stages from the bottom. In the second treatment unit group $G_2$, two sets of spinner type treatment unit, for instance, a resist coating unit (COT) and a developing unit (DEV) are stacked in turn in two stages from the bottom. These resist coating units (COT) are preferable to be disposed in the lower stage since the waste liquid of the resist liquid is troublesome from the mechanical and also maintenance point of view. However, as the needs arise, it is naturally possible to dispose them appropriately in the upper stage.

Figure 3:
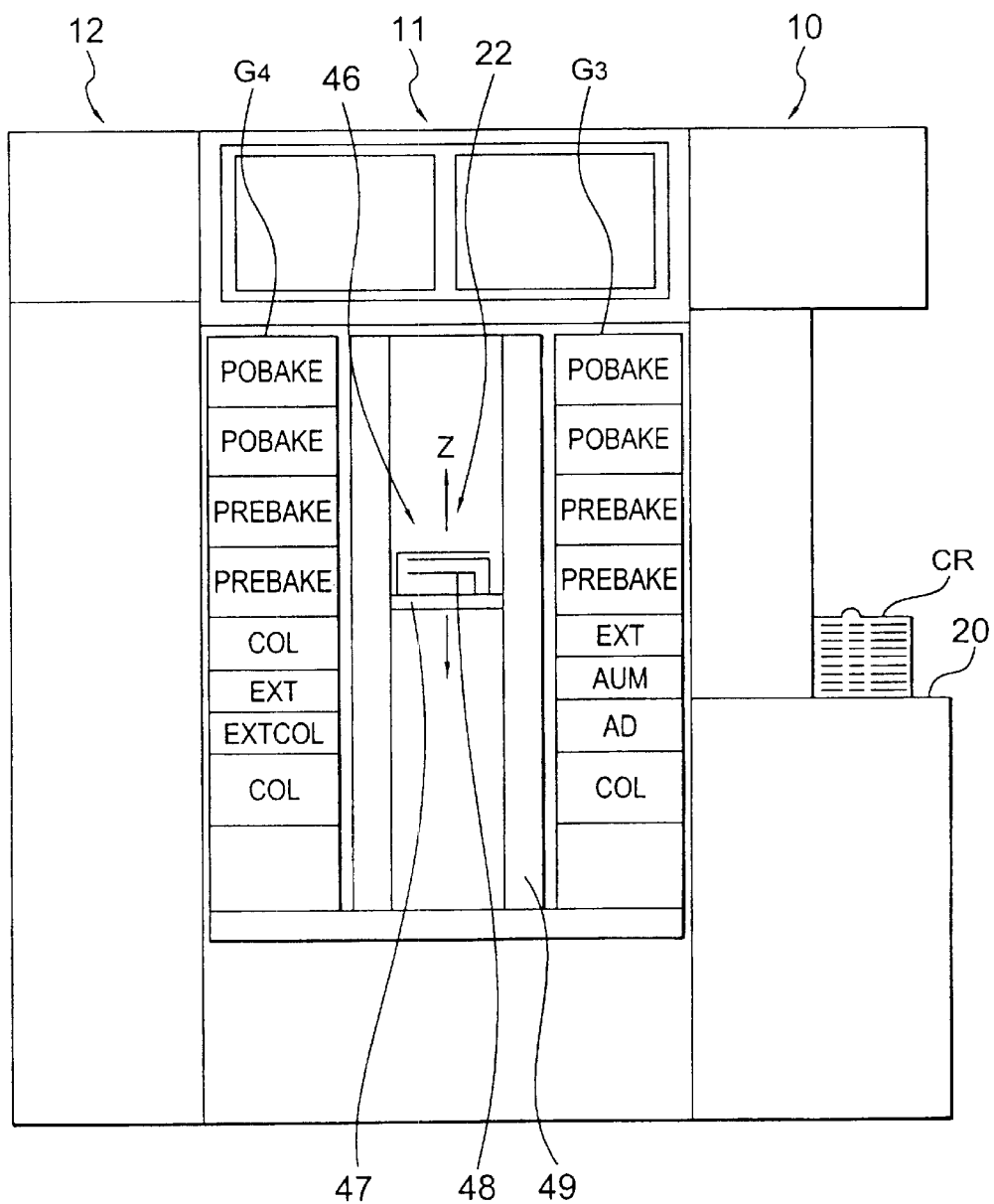
FIG. 3 is a back view of a coating/developing treatment system provided with a resist coating unit involving one embodiment of the present invention.

FIG. 3 is a back view of the aforementioned coating/developing treatment system 1.

In the main wafer carrying system 22, inside a cylindrical holder 49, an wafer carrier 46 is disposed capable of moving freely in the up and down direction (Z direction). The cylindrical holder 49 is connected to a rotating axis of a motor (not shown in the figure), and, due to the rotating driving force of this motor, is rotated integrally with the wafer carrier 46 with the rotating axis as a center, thereby the wafer carrier 46 is made capable of freely rotating in the θ direction. Incidentally, the cylindrical holder 49 can be constituted to connect to a different rotating axis (not shown in the figure) which is rotated by the aforementioned motor.

To the wafer carrier 46, a plurality of pieces of holding members 48 capable of moving freely in the forward and backward direction of a carrying stage 47 are disposed, thereby these holding members 48 make possible to deliver the wafers W between the respective treatment units.

Further, as shown in FIG. 1, in the coating/developing treatment system 1, five treatment unit groups $G_1$, $G_2$, $G_3$, $G_4$, and $G_5$ are possible to dispose, the multistage units of the first and the second treatment unit group $G_1$ and $G_2$ can be disposed in the front (this side in FIG. 1) side of the system, the multistage unit of the third treatment unit group $G_3$ can be disposed adjacent to the cassette station 10, the multistage unit of the fourth treatment unit group $G_4$ can be disposed adjacent to the interface portion 12, and the multistage unit of the fifth treatment unit group $G_5$ can be disposed at the rear side.

As shown in FIG. 3, in the third treatment unit group $G_3$, a treatment unit of oven type carrying out the predetermined treatment with an wafer placed on a stage (not shown in the figure), for instance, a cooling unit for carrying out cooling treatment (COL), an adhesion unit (AD) for carrying out so-called hydrophobic treatment for enhancing the fixing property of the resist, an alignment unit (ALIM) for carrying out alignment, an extension unit (EXT), and a pre-baking unit (PREBAKE) for carrying out heat treatment preceding the exposure treatment and post-baking unit (POBAKE) for carrying out heat treatment after exposure are stacked in turn, for instance, in eight stages from the bottom. In the fourth treatment unit group $G_4$ too, the treatment units of oven type, for instance, a cooling unit (COL), an extension/cooling unit (EXTCOL), an extension unit (EXT), a cooling unit (COL), a pre-baking unit (PREBAKE) and a post-baking unit (POBAKE) are stacked in turn in eight stages from the bottom.

Thus, by disposing the cooling unit (COL) and extension/cooling unit (EXTCOL) of low treatment temperatures at the lower stage, and by disposing the pre-baking unit (PREBAKE) and post-baking unit (POSTBAKE) of high treatment temperatures at the upper stage, the mutual thermal interference between the units can be made less. They can be naturally disposed in random multistage arrangement.

As shown in FIG. 1, the interface portion 12 has a dimension of the depth direction (X direction) as identical as that of the treatment station 11 but a smaller dimension in the width direction (Y direction). In the front surface portion of the interface portion 12, there are disposed a portable pick-up cassette CR and a fixed type buffer cassette BR in two stages, on the other hand, in the rear surface portion thereof, a periphery exposing device 23 is disposed, further in the central portion, an wafer carrier 24 is disposed. This wafer carrier 24 gains access, by moving in the X direction and Z direction, to both cassettes of CR and BR and the periphery exposing device 23.

The wafer carrier 24 is also capable of freely revolving in the θ direction, thereby can gain access to the extension unit (EXT) disposed in the multistage unit of the fourth treatment unit group $G_4$ on the side of the treatment station 11 or an wafer delivery stage (not shown in the figure) on the side of the adjacent exposing device.

Further, in the coating/developing treatment system 1, as described above, even onto the side of the rear surface of the main wafer carrying system 22, the multistage unit of the fifth treatment unit group $G_5$ shown by the dotted line in FIG. 1 can be disposed. However, the multistage unit of the fifth treatment unit group $G_5$ is capable of moving in Y direction along a guide rail 25. Therefore, even in the case of the multistage unit of the fifth treatment unit group $G_5$ being disposed as shown in the figure, by moving along this guide rail 25, a space portion can be secured, accordingly, maintenance operation to the main wafer carrying system 22 can be carried out easily from behind.

Next, a resist coating unit (COT) involving the present embodiment will be described.

Figure 4:
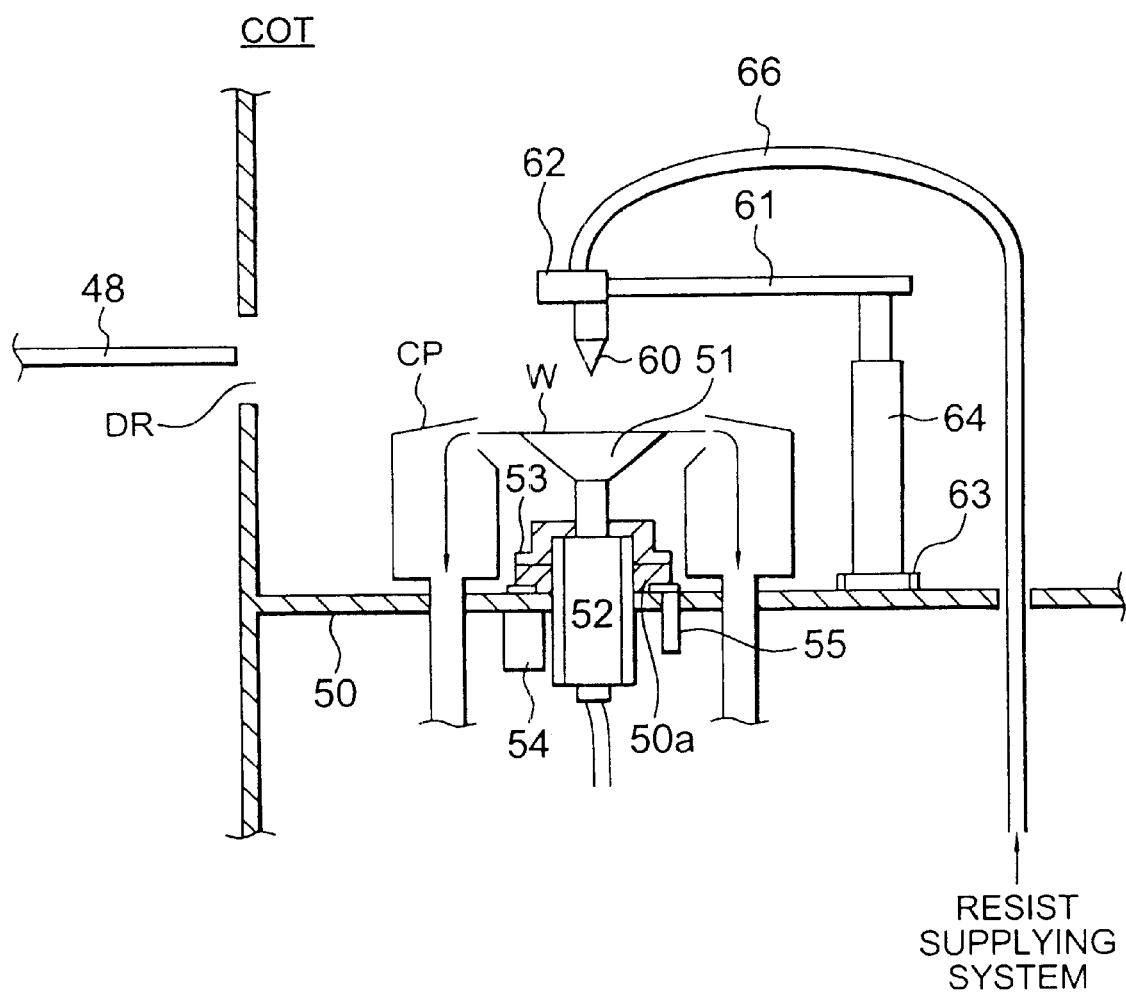
FIG. 4 is a cross section showing diagrammatically a resist coating unit involving the embodiment of the present invention.

FIG. 4 is a cross section showing diagrammatically the resist coating unit (COT) involving the present embodiment.

In the central portion of the resist coating unit (COT), a ring shaped cup CP is disposed and, inside the cup CP, a spin chuck 51 is disposed. The spin chuck 51 is rotated by a driving motor 52 in a state where an wafer W is held fixed by vacuum sucking.

The driving motor 52 is disposed capable of going up and down to an opening 50a bored in a unit bottom plate 50, and is combined with a means 54 of driving up and down and a means 55 of guiding up and down consisting of such as an air cylinder through a cap like flange member 53 consisting of such as aluminum.

A resist nozzle 60 for discharging a resist liquid as a coating liquid onto the surface of the wafer W is attached capable of putting on and taking off at the tip portion of a resist nozzle scan arm 61 through a nozzle holder 62. This resist nozzle scan arm 61 is attached to the top portion of a vertically holding member 64 which is capable of moving horizontally on the guide rail 63 disposed in one direction (Y direction) on the unit bottom plate 50 and is moved integrally in the Y direction together with the vertically holding member 64 by a not shown Y direction driving mechanism.

Figure 5:
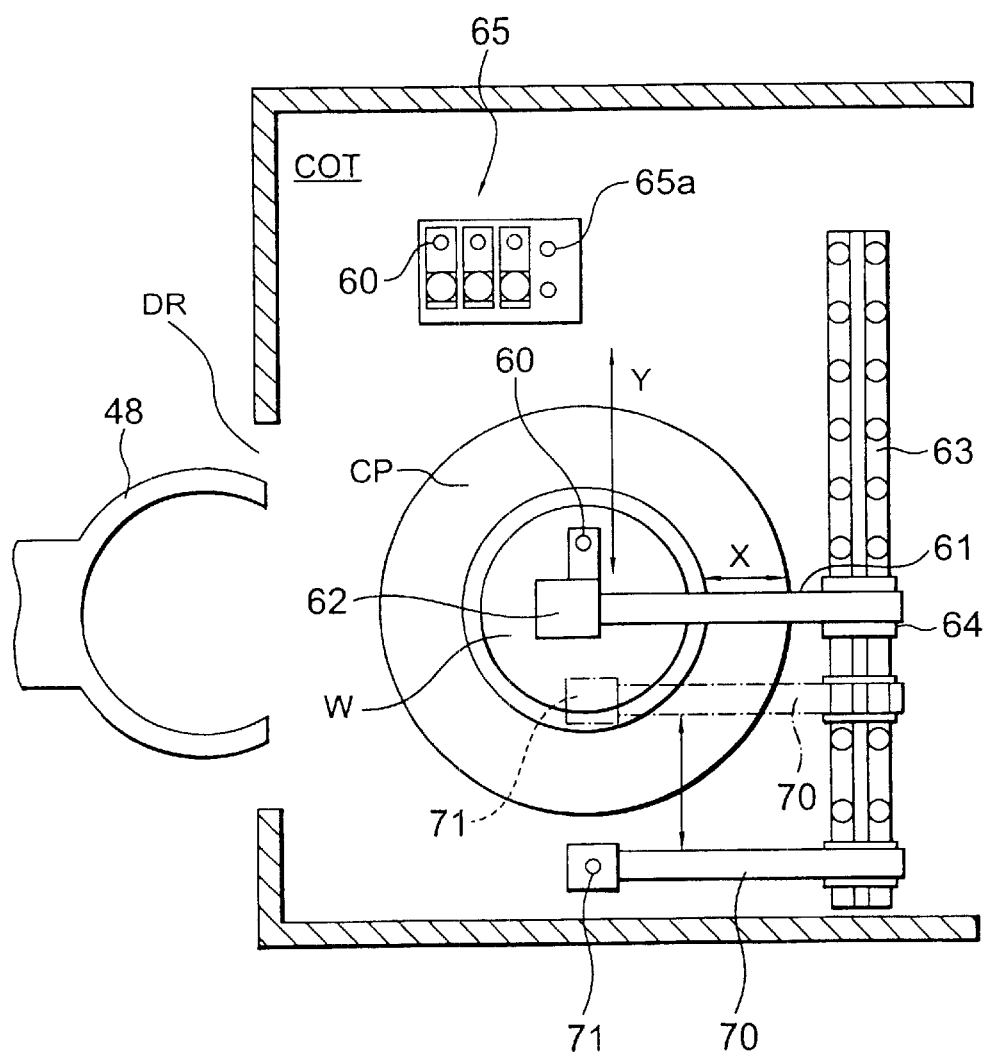
FIG. 5 is a plan view showing diagrammatically a resist coating unit involving the embodiment of the present invention.

FIG. 5 is a plan view showing diagrammatically the resist coating unit (COT) involving the present embodiment.

The resist nozzle scan arm 61 is capable of moving also in the X direction perpendicular to the Y direction in order to attach selectively the resist nozzle 60 at the resist nozzle waiting position 65, this is also moved in the X direction by a X-direction driving mechanism.

Further, the discharging mouth 60 of the resist nozzle 60 is inserted into a mouth 65a of a room of solvent atmosphere at the resist nozzle waiting position 65, thereby is exposed to the atmosphere of solvent. Thereby, the resist liquid of the tip of the resist nozzle 60 is prevented from solidifying or deteriorating. Further, by providing a plurality of the resist nozzles 60, 60, . . . , these resist nozzles 60 are separately used according to the kind and viscosity of the resist liquid.

Further, on the guide rail 63, not only the vertically holding member 64 which holds the resist nozzle scan arm 61, but also a vertically holding member 71 which holds a rinse nozzle scan arm 70 and is capable of moving in the Y direction is disposed.

The rinse nozzle scan arm 70 moves translationally or linearly between a rinse nozzle waiting position (the position shown by the solid line) disposed on the side direction of the cup CP and a rinse liquid discharging position (the position shown by the dotted line) disposed just above the periphery portion of a semiconductor wafer W disposed to the spin chuck 51.

As shown in FIG. 4, the resist nozzle 60 is connected to a resist liquid supplying system disposed in a downward room of the resist coating unit (COT) through a resist supplying conduit 66.

Figure 6:
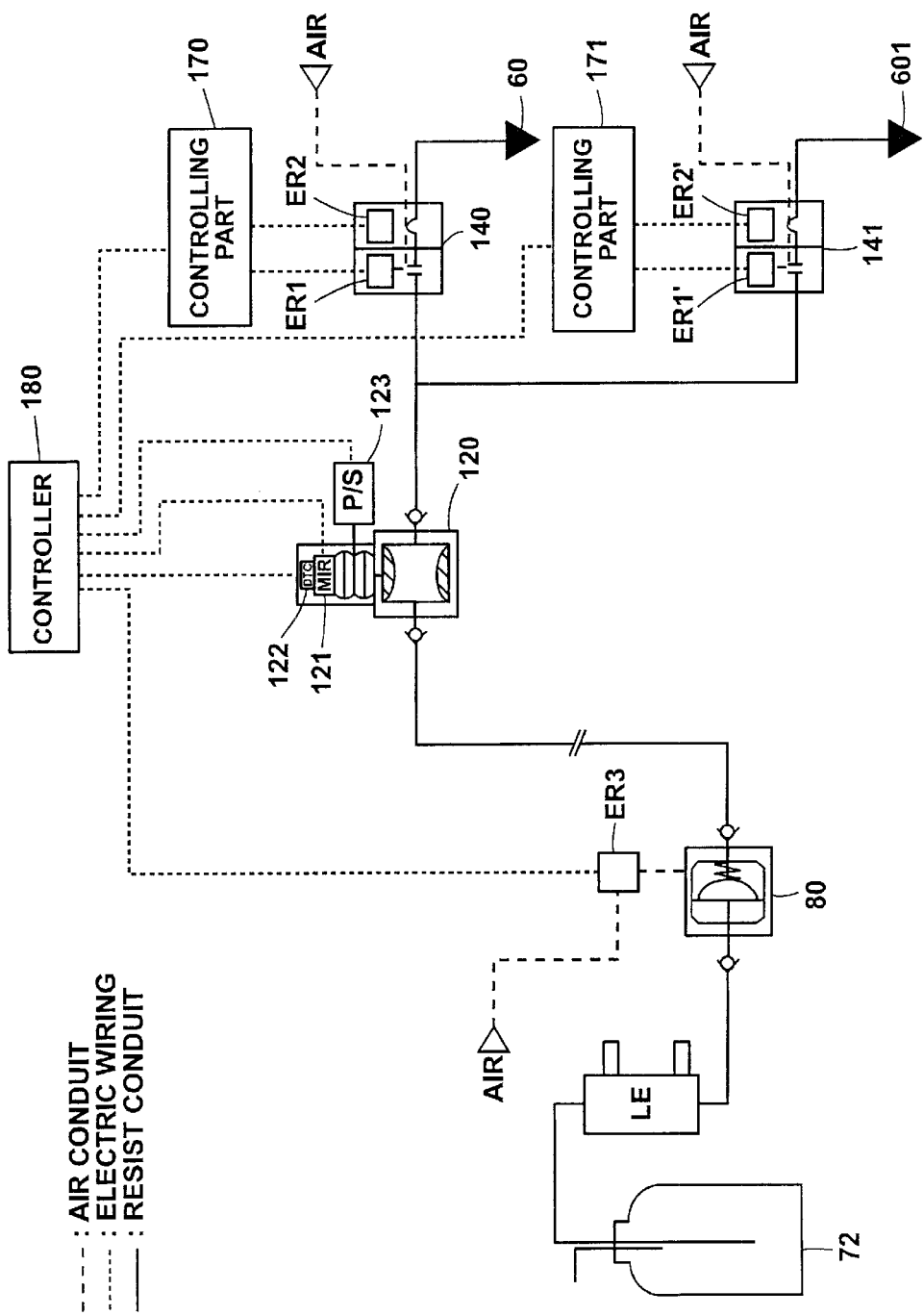
FIG. 6 is a diagram showing diagrammatically a constitution of a resist supplying system involving the embodiment of the present invention.

FIG. 6 is a diagram showing diagrammatically a constitution of a resist liquid supplying system of the resist coating unit (COT) involving the present embodiment.

In the resist liquid supplying system of the resist coating unit (COT) involving the present embodiment, between the resist nozzle 60 discharging the resist liquid to the wafer W and a resist tank 72 storing the resist liquid, a discharging pump 120 equipped with a pressure sensor 123 for detecting the pressure of the resist liquid on the down-stream side is disposed.

Between this discharging pump 120 and the resist nozzle 60, a valve 140 equipped with electric-air regulators ER1 and ER2 which control electrically the switching speed of the valve is disposed. Further, in this resist coating unit (COT), other than the aforementioned resist nozzle 60, a resist nozzle 601 similar to this is disposed concurrently, a valve 141 equipped with the electric-air regulators ER1' and ER2' which control electrically the valve switching speed is disposed. Switching between these resist nozzles 60 and 601 is carried out by switching the operation of the electric-air regulators ER1, ER2 and ER1', ER2' connected respectively to the controller 170 and 171, and the control of these is carried out integrally by a controller 180. By switching the valves 140 and 141 in turn cooperating with the operation of, for instance, the discharging pump 120, the resist liquid is discharged in turn from the resist nozzles 60 and 601, or by switching the valves 140 and 141 at the same time cooperating with the operation of the discharging pump 120, the resist liquid can be discharged at the same time from the resist nozzles 60 and 601.

Further, between the resist tank 72 and the discharging pump 120, there is disposed a supplying pump 80 provided with an electric-air regulator ER3 which controls the pressure of the resist liquid on the down-stream side. Between this supplying pump 80 and the resist tank 72, there is disposed a liquid level sensor LE which detects the height of the liquid level of the resist liquid in the resist tank 72.

Among the above, the electric-air regulator ER3 of the supplying pump 80, the motor 121 of the discharging pump 120, an encoder 122, and the pressure sensor 123 are connected with the controller 180, the operation thereof is controlled by the controller 180. Further, the electric-air regulators ER1 and ER2 of the valve 140 are connected to the controller 180 through a control portion 170 which controls exclusively the timing of the operation.

Figure 7:
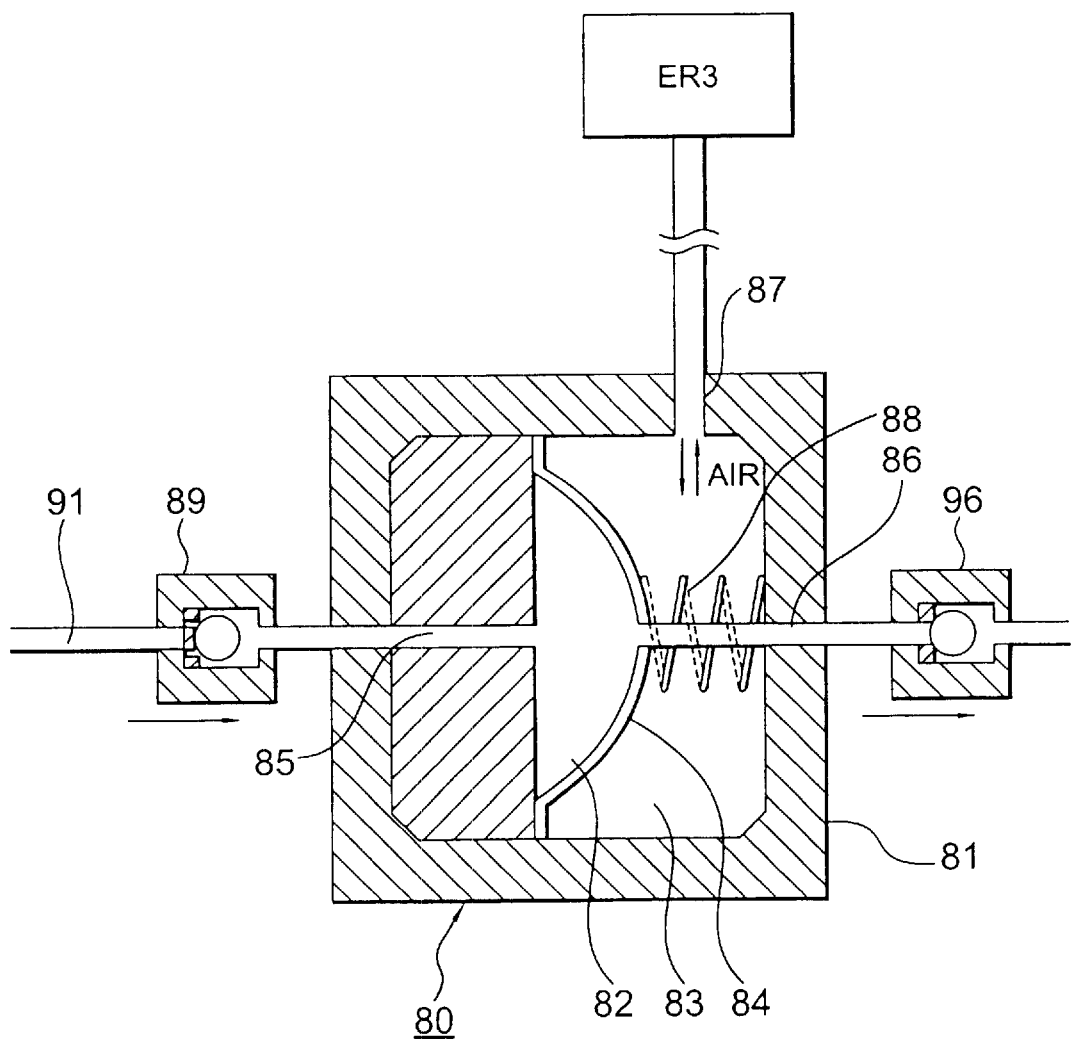
FIG. 7 is a diagram showing diagrammatically a constitution of a supplying pump involving the embodiment of the present invention.

FIG. 7 is a diagram showing diagrammatically the constitution of the supplying pump 80 of the resist coating unit (COT) involving the present embodiment.

In this supplying pump 80, a pump room 82 for storing the resist liquid in a body 81 and an air room 83 for storing a compressed air are disposed, and the pump room 82 and air room 83 are separated by a diaphragm 84 made of an elastic material such as silicone rubber or the like.

To the body 81, a flowing course 85 on the sucking side and a flowing course 86 on the discharging side are disposed, the flowing course 85 on the sucking side is connected with the pump room 82, on the other hand, the flowing course 86 on the discharging side is connected with the pump room 82 by penetrating the diaphragm 84. Further, in the upper portion of the figure of the air room 83, an air hole 87 is disposed, the compressed air from an air compressor which is not shown in the figure is introduced from here into the air room 83 through the electric-air regulator ER3 which will be described later. Further, the diaphragm 84 is forced by a spring 88 toward the right direction in the figure so that the content of the pump room 82 is made large.

The flowing course 85 on the sucking side and the flowing course 86 on the discharging side are provided with a check valve 89 of slow leak type which will be described later and an ordinary check valve 96, respectively. By these check valves 89 and 96, the resist liquid is made flow in the direction shown by an arrow in the figure.

The operation of this supplying pump 80 is carried out by taking in and out the compressed air between the air hole 87 and the air room 83.

In the state prior to taking in the compressed air into the air room, the diaphragm 84 is pulled by the spring 88 toward the right direction in the figure, and becomes an inflated state of a cup as shown in FIG. 7. In this time, the inside of the pump room 82 is filled by the resist liquid.

In this state, upon the compressed air being introduced into the air room 83 from the air hole 87, the atmospheric pressure in the air room 83 becomes high, due to this atmospheric pressure the diaphragm 84 is pushed to the left direction in the figure to tend to make small the volume. In this time, the pressure works on the resist liquid stored in the pump room 82, however the check valve 89 on the sucking side is kept closed.

On the other hand, the check valve 96 on the discharging side becomes an open state of the valve upon action of the pressure of the discharging direction, therefore, the pressurized resist liquid has its escape cut off to push open the check valve 96 on the discharging side, to flow out to the discharging side. As the result of this discharge, the diaphragm 84 contracts and the volume of the pump room 82 becomes small.

Next, upon reducing the pressure in the air room 83 by letting escape the compressed air in the air room 83 from the air hole 87, the diaphragm 84 is pulled to the right direction in the figure by the spring 88 to increase the volume of the pump room 82. In this time, due to occurrence of the negative pressure in the pump room 82, the resist liquid in the flowing course 85 on the sucking side is sucked in the pump room 82. The check valve 89 of the flowing course 85 on the sucking side is disposed so that the valve is opened upon the resist liquid moving in the right direction in the figure. Therefore, the resist liquid is supplied in turn from the flowing course 91 on the sucking side.

Next, an ordinary check valve 96 and a check valve 89 of slow leak structure will be described.

Figure 8A:
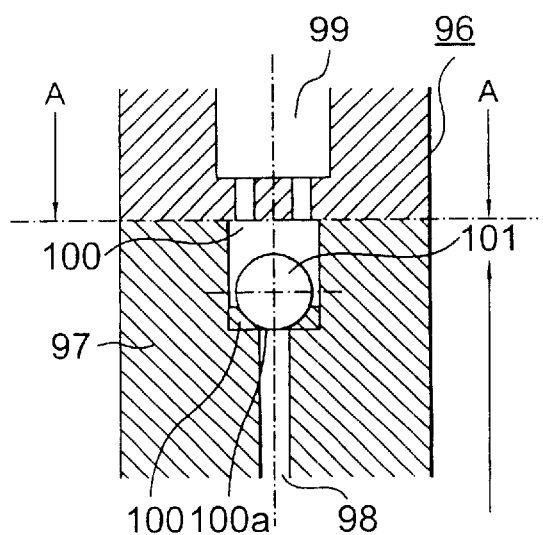
FIG. 8A and FIG. 8B are cross sections of a check valve involving the embodiment of the present invention.
Figure 8B:
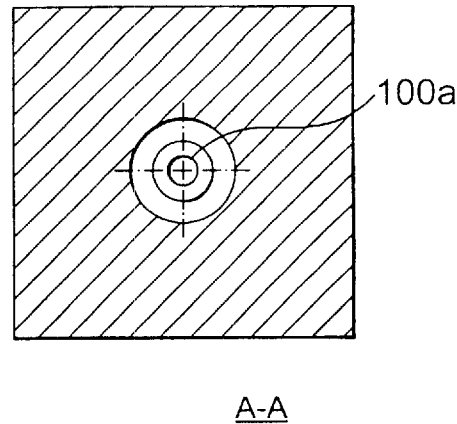

FIG. 8A is a cross section showing a structure of an ordinary check valve 96, and FIG. 8B is a diagram showing a state of the check valve 96 of FIG. 8A by cutting along A—A plane in the figure and seeing from the above direction in the figure.

As shown in FIG. 8A and FIG. 8B, in the ordinary check valve 96, between the flowing course 98 and flowing course 99, a valve room 100 for accommodating a spherical valve body 101 is disposed, and a bottom plate 100 therein a round hole 100a is bored is disposed on the bottom of the valve room 100. As shown in FIG. 8A and FIG. 8B, on the bottom plate 100 a round hole 100a is bored, when the valve body 101 makes a contact with the round hole 100a, a gap is hardly formed between the valve body 101 and the round hole 101a.

Therefore, in the ordinary check valve 96, when the resist liquid is going to flow from the above to the below in the figure, that is, from the flowing course 99 to the flowing course 98, the valve body 101 is pushed by the resist liquid to come into contact with the round hole 100a, there is hardly formed a gap between the valve body 101 and the round hole 100a. Accordingly, when the valve is closed, the resist liquid is completely prevented from moving.

On the contrary, in the case of the resist liquid flowing from the downward part to the upward part in the figure, the valve body 101 moves upward in the figure to make flow the resist liquid passing through a gap formed between the valve body 101 and the round hole 100a. Therefore, in the ordinary check valve 96, the resist liquid flows only in the direction shown by an arrow in the figure, and can not flow in the opposite direction.

Figure 9A:
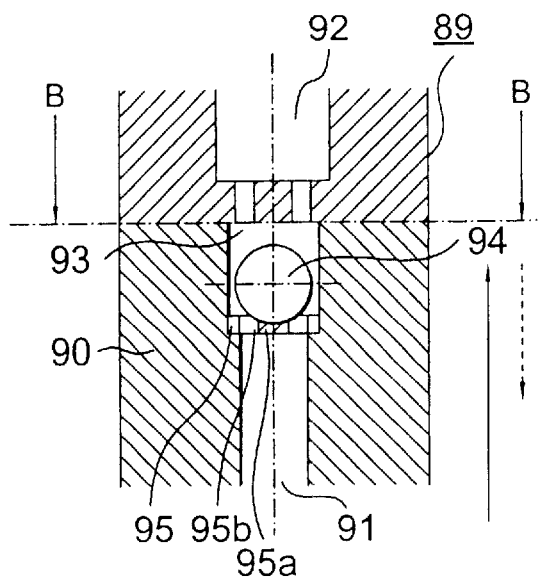
FIG. 9A and FIG. 9B are cross sections showing a structure of a conventional check valve.
Figure 9B:
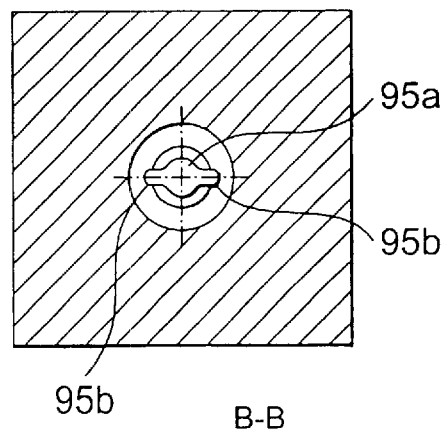

FIG. 9A is a cross section showing a structure of a check valve 89 disposed in the flowing course 85 on the sucking side of the aforementioned supplying pump 80, and FIG. 9B is a diagram showing a state of a check valve 89 of FIG. 9A by cutting along the B—B plane in the figure and seeing from the above direction in the figure. In this check valve 89 too, as identical as the aforementioned ordinary check valve 96, inside the valve room 93 disposed between the flowing course 91 penetrating the valve body 90 and the flowing course 92, a spherical valve body 94 is accommodated movable up and down, and a bottom plate 95 is disposed on the bottom of the valve room 93.

In this check valve 89, different from an ordinary check valve 96 employed in the flowing course 86 on the discharging side, a slow leak structure permitting a slight spillage of the fluid even when the valve is closed is disposed between the flowing course 91 and the flowing course 92.

That is, as shown in FIG. 9A and FIG. 9B, a groove 95b is added in the diameter direction of the round hole 95a disposed in the bottom plate 95, accordingly even when the valve body 94 makes a contact with the round hole 95a, the portion of the groove 95b is kept opened.

Therefore, if the valve body 94 pushed by the resist liquid makes contact with the round hole 95a, between the valve body 94 and the round hole 95a, a small gap of the portion of the groove 95b can be secured, accordingly, even when the valve is closed, a slight amount of the resist liquid flows from the flowing course 92 to the flowing course 91.

Thus, in the supplying pump 80 of the present embodiment, the check valve 89 provided with a slow leak structure on the flowing course 85 on the sucking side is disposed, resulting in a smaller pressure fluctuation.

Figure 10:
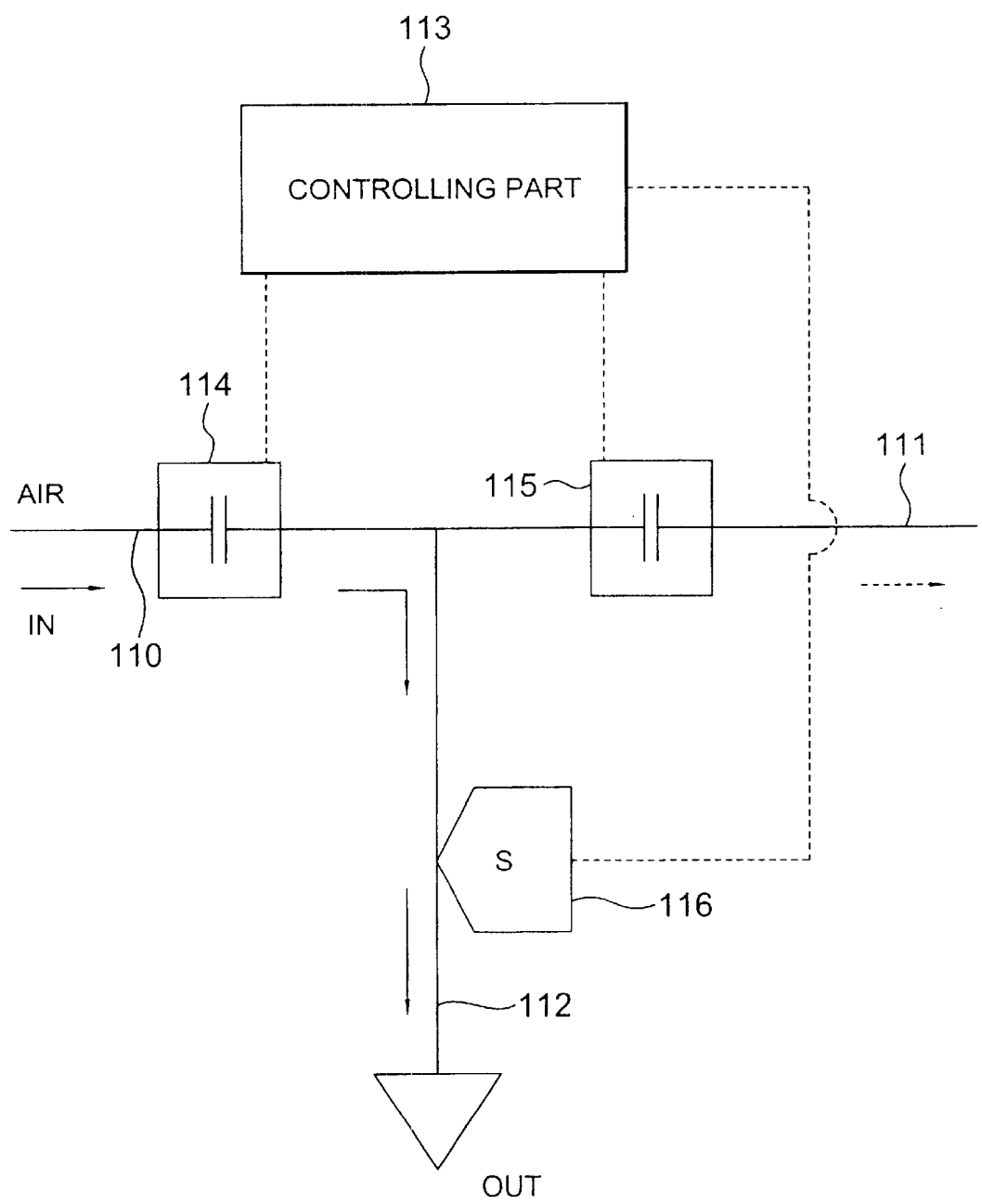
FIG. 10 is a diagram showing schematically a constitution of an electric-air regulator involving the embodiment of the present invention.

FIG. 10 is a diagram showing schematically a constitution of an electric-air regulator ER employed in a coating apparatus involving the present embodiment.

In this electric-air regulator ER, to a combined portion of a flowing course 110 on the sucking side letting flow the air and a flowing course 111 on the exhaust side, a flowing course 112 on the outputting side is connected, to the respective flowing course 110 on the sucking side and the flowing course 111 on the exhausting side, solenoid valves 114 and 115 which switch the flowing courses upon reception of the electrical signal from the controller 113 are disposed. The flowing course 110 on the sucking side is connected to a compressed air supplier such as an air compressor, and the flowing course 112 on the outputting side is connected to a device driven by the compressed air such as a valve or a diaphragm. On the other hand, to the flowing course 113 on the outputting side, a pressure sensor 116 connected to the controller is disposed.

Upon operating the electric-air regulator ER in this state, the solenoid valves 114 and 115 are controlled in their operation by the controller 113 based on the pressure of the flowing course 112 on the outputting side detected by the pressure sensor 116, thereby the pressure inside of the flowing course 112 on the outputting side is adjusted to be the set point.

For instance, in the case of, by setting the pressure inside of the flowing course 112 on the outputting side at 3.0 $kg/cm^2$, the compressed air of 5.0 $kg/cm^2$ being supplied from the air compressor to the flowing course 110 on the sucking side, since the solenoid valve 115 is normally being closed, the solenoid valve 114 is opened to let flow the compressed air of 5.0 $kg/cm^2$ to the flowing course 112 on the sucking side. When the pressure inside of the flowing course 112 on the sucking side is detected to be above the set point of 3.0 $kg/cm^2$ by the pressure sensor 116, the controller 113 makes the solenoid valve 114 on the sucking side close immediately, thereby prevents the pressure inside of the flowing course 112 on the outputting side from overflowing largely out of the set point of 3.0 $kg/cm^2$. At the same time, by opening the solenoid valve 115 on the exhausting side, the pressure inside of the flowing course 112 on the outputting side is made go down to the set point of 3.0 $kg/cm^2$, and when this set point is reached, the solenoid valve on the exhausting side is closed.

On the other hand, in the case of the pressure inside of the flowing course 112 on the outputting side being lower than the set point, the solenoid valve 115 is closed, the solenoid valve 114 is opened to introduce the compressed air of high pressure, and when the pressure detected by the pressure sensor 116 is the set point, the solenoid valve 114 is closed.

In this electric-air regulator ER, the flowing course 110 on the sucking side, the flowing course 111 on the exhausting side, the flowing course 112 on the outputting side, the solenoid valves 114 and 115 and the pressure sensor 116 are accommodated compact in a square of only 1 to several cm, accordingly the total length of the continuing flowing course up to the solenoid valves 114 and 115 and the detecting portion of the pressure sensor 116 is only 1 to several cm. Moreover, the solenoid valves 114 and 115 are instantaneously switched, therefore the time lag up to the start of the action can be almost neglected.

Therefore, by intervening this electric-air regulator ER between a device driven by compressed air such as the aforementioned supplying pump 80 or a valve 140 which will be described later and the air compressor to regulate the driving air pressure, the pressure of the driving air can be regulated accurately, or the time lag up to start of the operation can be made as short as possible.

Next, a pump being employed in the coating apparatus of the present embodiment will be described.

Figure 11:
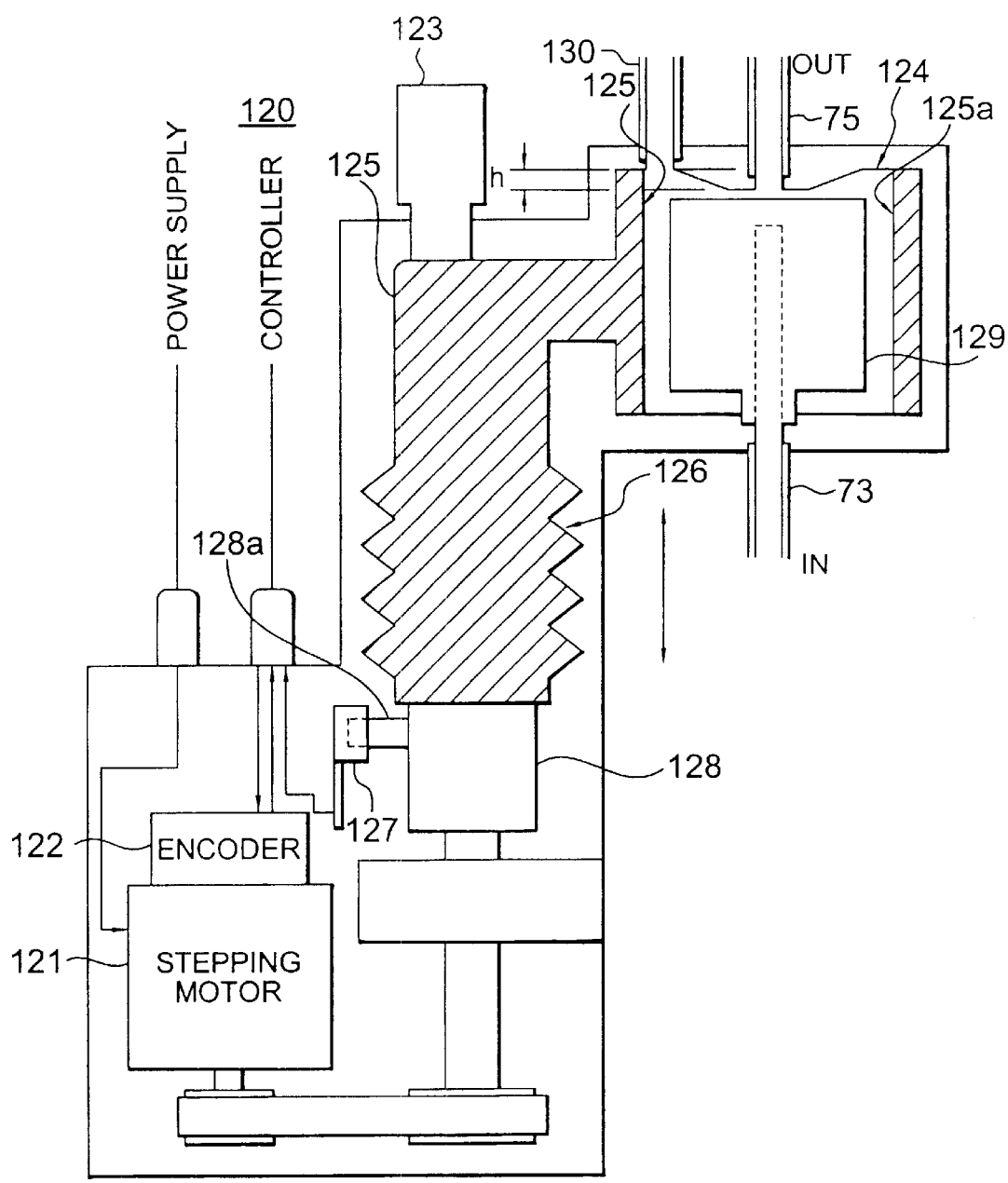
FIG. 11 is a diagram showing the detail of a discharging pump involving the embodiment of the present invention.

FIG. 11 is a diagram showing the detail of a pump 120 being employed in the coating apparatus involving the present embodiment.

This pump 120 is a filter-integrated bellows pump, as the mechanism by which the liquid is sent compressed, a tubephragm pump which sucks and discharges the resist liquid by making variable the pressure in the pump room 124 through change of the volume of the room is adopted.

In this pump 120, a pump room 124 is disposed almost cylindrical, the inside wall of the circumference thereof is formed of an elastic film 125a of the tubephragm 125 consisting of such as PFA in which a fluid (liquid) is enclosed. This inside wall of the circumference of the pump room 124 is inflated or contracted through expanding and contracting movement of the bellows portion 126 in the tubephragm 125, thereby the volume and pressure of the pump room 124 are made variable.

The bellows portion 126 is driven expanding and contracting with high accuracy by the power of a motor such as a stepping motor 121, by a not shown controller, the timing of expanding and contracting movement or the speed thereof, that is, the timing of sucking/discharging or the speed of sucking/discharging, are controlled according to the set points. Further, an encoder 122 is connected to the stepping motor 121, the amount of movement of the stepping motor 121 is feed-backed to the controller.

Reference numeral 127 denotes a light transmitting sensor, which interferes with a shutter member 128a attached to a movable holder 128 of the bellows portion 126 to detect the starting point or finishing point of expanding and contracting of such as bellows portion 126. By outputting the detected signals to the controller, the stepping motor 121 is controlled.

A sucking conduit 73 for introducing the resist liquid into the pump room 124 is connected to the pump room 124 in the state where many holes bored on the surface of the circumference of its tip end are opened inside of a filter 129, on the other hand, a discharging conduit 75 is connected in the state of being opened in the space other than filter in the pump room 124. That is, in this filter-integrated bellows pump 120, the resist liquid is filtered by passing through the filter 129 in the course of sucking due to decompression inside of the pump room 124, during pressurization of the inside of the pump room 124, the filtered resist liquid is discharged.

Incidentally, in the neighborhood of the openings of the sucking conduit 73 and discharging conduit 75, check valves of ball style (not shown in the figure) are disposed for preventing backward flow from occurring, respectively.

Further, to this pump, a pressure sensor 123 for detecting the pressure of the resist liquid during discharging is disposed, the pressure of the resist liquid detected here during discharging is sent to the controller 180 connected to the pressure sensor.

As the liquid to be enclosed in the tubephragm 125, Teflon oil or other oil, further the liquid such as pure water are preferable. By enclosing the liquid inside of the tubephragm 125, the change on standing of the volume within the tubephragm 125 can be suppressed compared with one in which a gas is enclosed, thereby a long term stabilization of the inside wall surface of the circumference of the pump room 124 can be attained with respect to inflation/contraction characteristic thereof.

Further, to the filter-integrated tubephragm pump 120, a vent 130 for extracting foams which is opened into the space within the pump room 124 other than the filter 129 is disposed.

Between the opening of the vent 130 and the opening of the discharging conduit 75, there is disposed a height difference h, the foams generated in the pump room 124 stay at the position higher than the opening of the discharging conduit 75, therefrom they are exhausted by the vent 130 for extracting foams. Thereby, the foams are made not likely to intrude into the discharging conduit 75, the amount of the foams in the resist liquid being supplied to the wafer W can be reduced.

Incidentally, to the vent 130 for extracting foams, a not shown valve is connected, and, periodically, for instance, every time of replacement of the resist tank 72, by opening this valve, the foams stayed at the upper portion of the pump room 124 can be exhausted.

Figure 12:
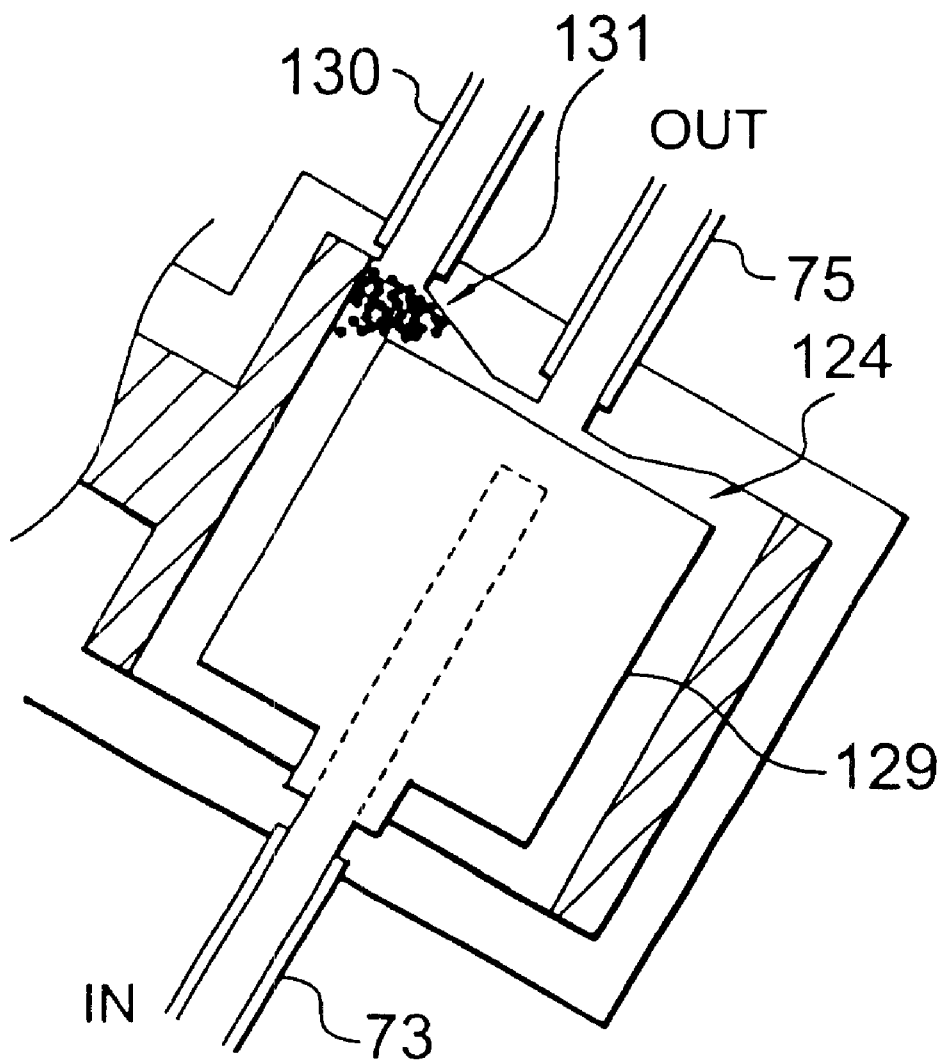
FIG. 12 is a diagram showing a state of attachment of a filter involving the embodiment of the present invention.

FIG. 12 is a diagram showing a state of attachment of the filter 129.

Further, the filter-integrated tubephragm 120 like this, as shown in FIG. 12, is preferable to be disposed tilted to the horizontal level so that the position of the opening of the vent 130 for extracting foams comes to the neighborhood of the summit. By implementing like this, in the neighborhood of the opening of the vent 130 for extracting foams, the foams 131 in the pump room 124 gather, resulting in efficient exhaust of the foams.

In the following, operation of the pump 120 will be described.

This pump 120 carries out alternately each action of sucking and pressure sending.

Figure 13:
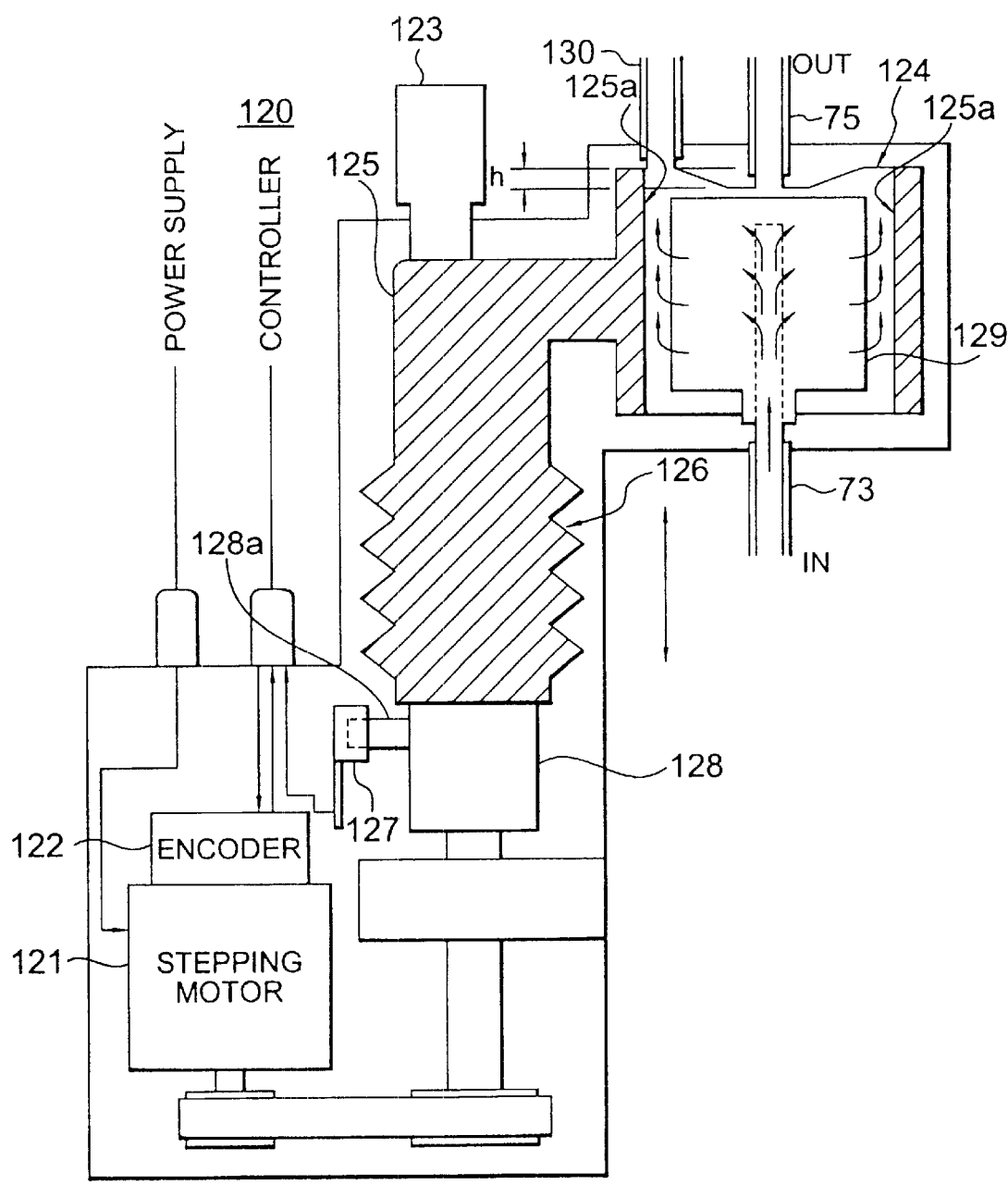
FIG. 13 is a diagram showing an action during sucking back of the discharging pump involving the embodiment of the present invention.

FIG. 13 is a diagram showing operation of the discharging pump 120 during sucking.

During sucking, by driving the stepping motor 121, the bellows portion 126 of the tubephragm 125 is expanded in the direction shown by the arrow, thereby makes the surface of the inside wall of the circumference of the pump room 124 a non-inflated (non-protruded) state to make the reduced pressure state inside of the pump room 124 against the atmospheric pressure, thereby the resist liquid in the resist tank 72 is sucked into the pump room 124 through the sucking conduit 73. At this time, since the sucking conduit 73 opens many holes bored on the circumference surface of the tip portion thereof within the filter 129, the resist liquid is sucked into the pump room 124 passing through the inside of the filter 129, thereby the resist liquid is filtered.

Next, the pump 120 sends by pressure the sucked liquid.

Figure 14:
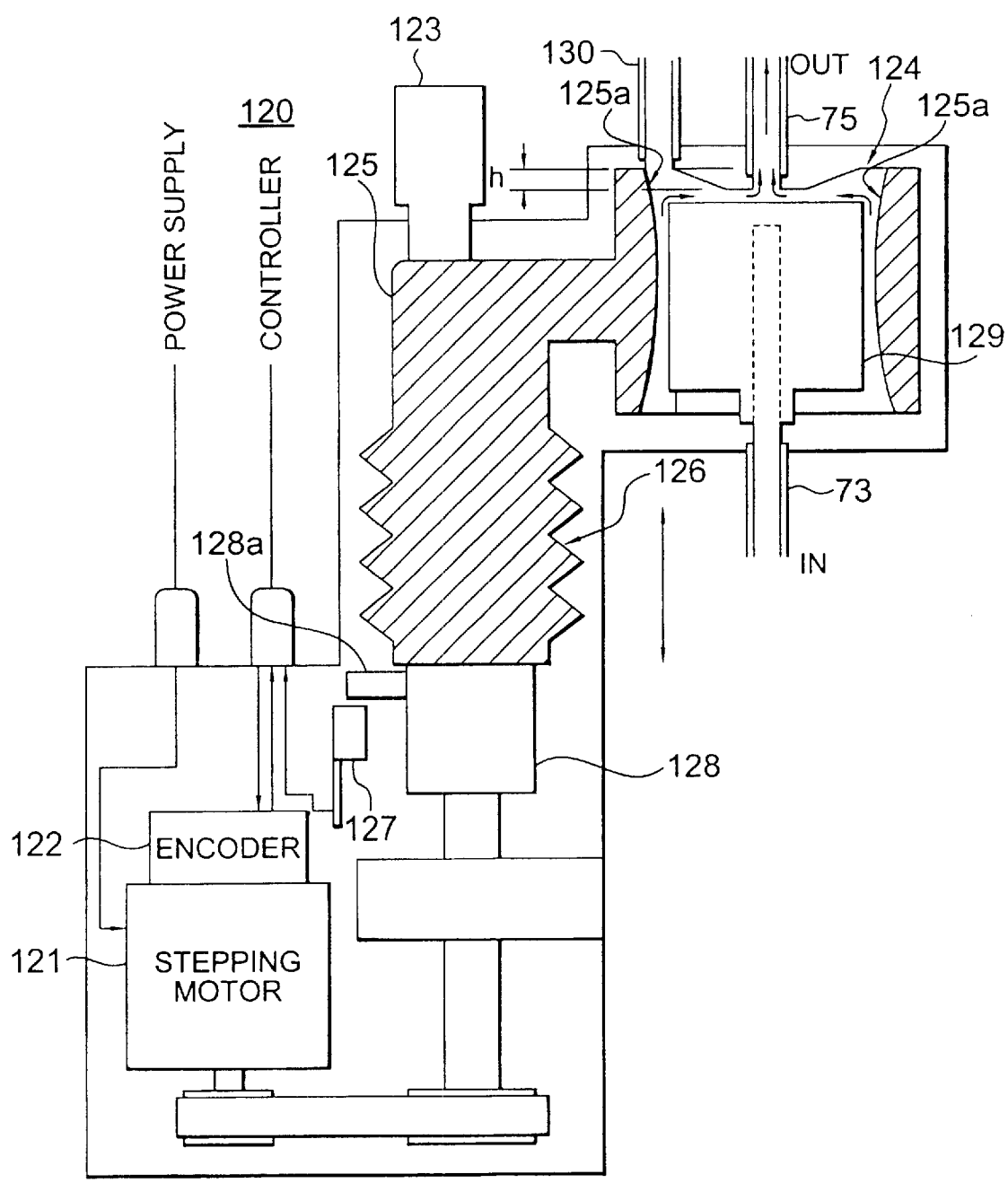
FIG. 14 is a diagram showing an action of the discharging pump involving the embodiment of the present invention during pressurized sending.

FIG. 14 is a diagram showing operation of the discharging pump 120 during pressure sending.

When the resist liquid once sucked is sent by pressure, by driving the stepping motor 121, the bellows portion 126 of the tubephragm 125 is compressed, by reducing the volume inside of the pump room 124 by making the surface of the inside wall of the circumference of the pump room 124 the inflated/protruded state, the pressure in the pump room 124 is increased, thereby the filtered resist liquid in the pump room 124 is discharged from the discharging conduit 75.

In this pump 120, the filtration is carried out during sucking as described above, the resist liquid can go through against the filter 129 with relatively slow speed, accordingly there is no chance of making pass the once captured particles or the gelled resist through the mesh of the filter 129 by pressing strong the filter 129 or of occurrence of foams in the resist liquid during going through the filter 129.

Figure 15:
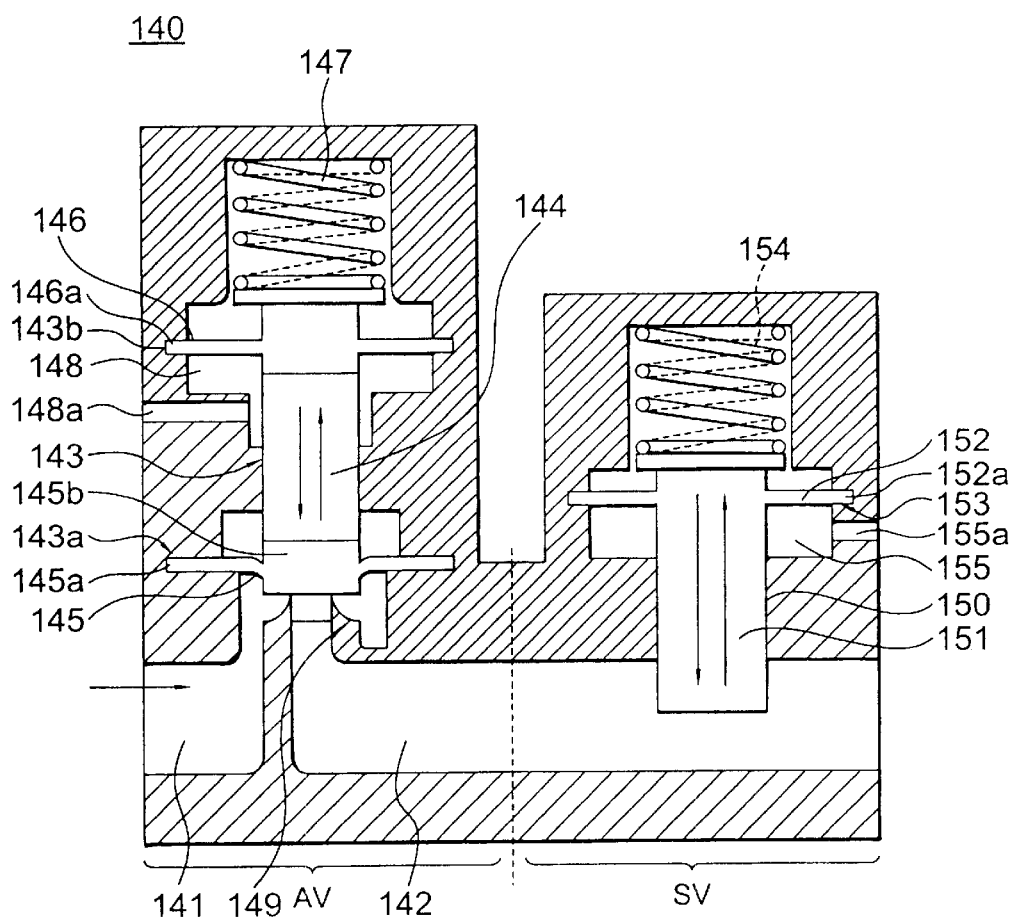
FIG. 15 is a vertical cross section of a valve involving the embodiment of the present invention.

FIG. 15 is a vertical cross section of a valve 140 of a resist coating unit (COT) involving the present embodiment. The valve 140 is a valve of air operation type which carries out the action of opening and closing driven by the compressed air.

To the valve 140 used in the resist coating unit (COT) involving the present embodiment, in addition to a switching valve AV for switching the flowing course of the resist liquid, there is disposed a suck-back valve SV on the down stream side of the moving direction of the resist liquid.

In the switching valve AV, between the flowing course 141 on the sucking side and the flowing course 142 on the discharging side, a cylinder 143 is disposed, and, the flowing course 141 on the sucking side and the flowing course 142 on the discharging side are disposed adjacently through a cylindrical gate portion 149 having a tapering tip.

Inside the cylinder 143, a rod 144 is held movable up and down in the figure through diaphragms 145 and 146, and is pressed downward in the figure by a spring 147. These diaphragms 145 and 146 are made of a flexible material such as silicone rubber.

The center portion of this diaphragm 145 constitutes a columnar valve body 145b of the same exterior diameter with the rod 144, the upper surface thereof is combined with the lower end of the rod 144. The valve body 145b moves up and down direction in the figure together with the rod 144, the surface of the lower end of the valve body 145b contacts and separates with and from the upper surface of the gate portion 149. Thereby, the flowing course 141 on the sucking side and the flowing course 142 on the discharging side are opened and closed therebetween.

The respective exterior periphery portions 145a and 146a of the diaphragms 145 and 146 are engaged and fixed respectively to the grooves 143a and 143b disposed on the side of the switching valve AV body.

Above the cylinder 143 and below the diaphragm 146, an air room 148 is disposed, this air room 148 is communicated with the exterior through an operation port 148a, and, to this operation port 148a, an air compressor (not shown in the figure) is connected through the aforementioned electric-air regulator ER1.

In a state where the electric-air regulator ER1 is not operated and the compressed air from the air compressor is not sent into the air room 148, due to downward pressing force of the spring 147, the valve body 145b of the lower end portion of the rod 144 and the gate portion 149 are closed therebetween.

To operate this switching valve AV, the electric-air regulator ER1 is started to operate, thereby the compressed air from the air compressor is sent into the air room 148. Then, the diaphragm 146 is deformed by the power of the compressed air to push up the rod 144, thereby a gap is formed between the valve body 145b and the gate portion 149 to make communicate between the flowing course 141 on the sucking side and the flowing course 142 on the discharging side.

In the suck-back valve SV, the flowing course 142 on the sucking side is extended from the side of the switching valve AV, and, above the flowing course 142 on the sucking side, a cylinder 150 is disposed. Inside of this cylinder 150, a rod 151 is accommodated movable up and down in the figure, and a part of the lower part of the rod 151 protrudes above the flowing course 142 on the sucking side from the cylinder 150.

Above the rod 151, a flange-like diaphragm 152 is disposed, the exterior periphery portion 152a of the diaphragm 152 is engaged and fixed to a groove 153 disposed on the body side of the suck-back valve SV. This diaphragm 152 is made of a flexible material such as silicone rubber.

On the above side of the rod 151, a spring 154 is disposed, thereby the rod 151 is pressed downward in the figure. Above the cylinder 150 and below the diaphragm 152, an air room 150 is disposed, this air room 150 is communicated with the exterior through the operation port 150a, and, to this operation port 150a, an air compressor (omitted in the figure) is connected through the aforementioned electric-air regulator ER2 (omitted in the figure).

In a state where the electric-air regulator ER2 is not operated and the compressed air from the air compressor is not sent into the air room 150, due to the downward pressing force of the spring 154, the lower portion of the rod 151 protrudes into the flowing course 142 on the downstream side.

To operate this suck-back valve SV, the electric-air regulator ER2 is made operate to send in the compressed air from the air compressor into the air room 150 through the electric-air regulator ER2. Then, the diaphragm 154 is deformed by the force of the compressed air to push up the rod 151, thereby the lower portion of the rod 151 is sucked inside the cylinder 150.

At this time, the switching valve AV is being closed, accordingly the negative pressure caused by sucking of the rod 151 and acting on the resist liquid in the flowing course 142 on the down stream side acts on the resist liquid at the further down stream side of the valve 140, thereby sucks the surface of the resist liquid at the tip end of the resist nozzle 60 inside the resist nozzle 60.

Next, operation of a coating/developing treatment system 1 constituted as mentioned above will be described.

When the coating/developing treatment system 1 equipped with the resist coating unit (COT) of the present embodiment is made operate, an wafer W is taken out of an wafer cassette CR, carried by the main wafer carrying mechanism 22, and sucked and held by the spin chuck 51 inside the resist coating unit (COT). Thereafter, the resist coating operation starts.

First, at the same time with the start of the rotation of the wafer W due to the rotation of the spin chuck 51, a thinner discharging mechanism which is not shown in the figure is made operate to discharge the thinner on the wafer W from the position immediately above the approximate center of the wafer W. The dripped thinner is spread all over the surface of the wafer W due to the centrifugal force and the superfluous thinner is removed by shaking off due to the centrifugal force.

Then, the resist nozzle scan arm 61 is moved, thereby the resist nozzle 60 is moved to the position just above the approximate center of the wafer W.

On the other hand, prior to the start of the rotation of the spin chuck 51, at the discharging pump 120, the resist liquid is sucked. The sucking action of the discharging pump 120 is carried out by synchronizing the sucking action of the discharging pump 120 and the discharging action of the supplying pump 80. In the concrete, the sucking speed and the amount of sucking of the discharging pump 120 are estimated from the speed of increase of the volume of the bellows 126 of the discharging pump 120 and the amount of drive of the stepping motor 121, the supplying pump 80 is driven by regulating the electric-air regulator ER3 so as to supply the resist liquid to the discharging pump 120 at the same speed with the above estimated one.

Then, at the same time with the high speed rotation of the spin chuck 51 which holds the wafer W, synchronizing with the rotation of the spin chuck 51, the discharging pump 120 and the switching valve AV are made operate with the predetermined timing to let drip the predetermined amount of the resist liquid from the resist nozzle 60 stayed just above the approximate center of the wafer W.

The dripped resist liquid is spread over the whole surface of the wafer W due to the centrifugal force similarly with the aforementioned thinner, and the superfluous resist liquid is removed by shaking off due to the centrifugal force. Then, the wafer W is taken out of the resist coating unit (COT) and sent to the following treatment unit, for instance, a drying unit.

Now, the mutual movements between the supplying pump 80, the discharging pump 120, the switching valve AV, the suck-back valve SV and the resist nozzle 60 of the resist liquid supply system of the resist coating unit (COT) involving the present embodiment will be described along the respective timing chart.

Figure 16:
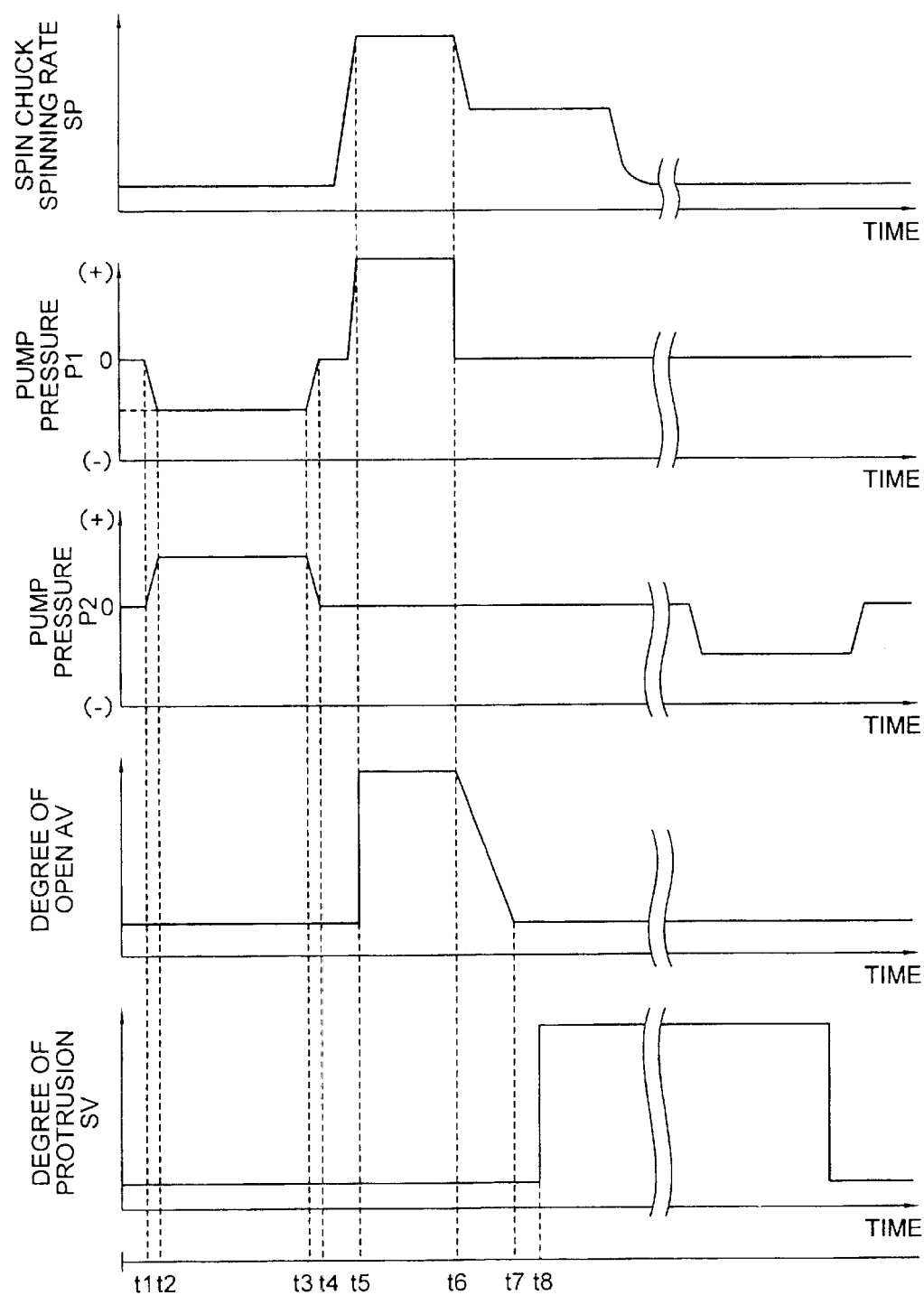
FIG. 16 is a timing chart of a resist liquid supplying system involving the embodiment of the present invention.
Figure 17:
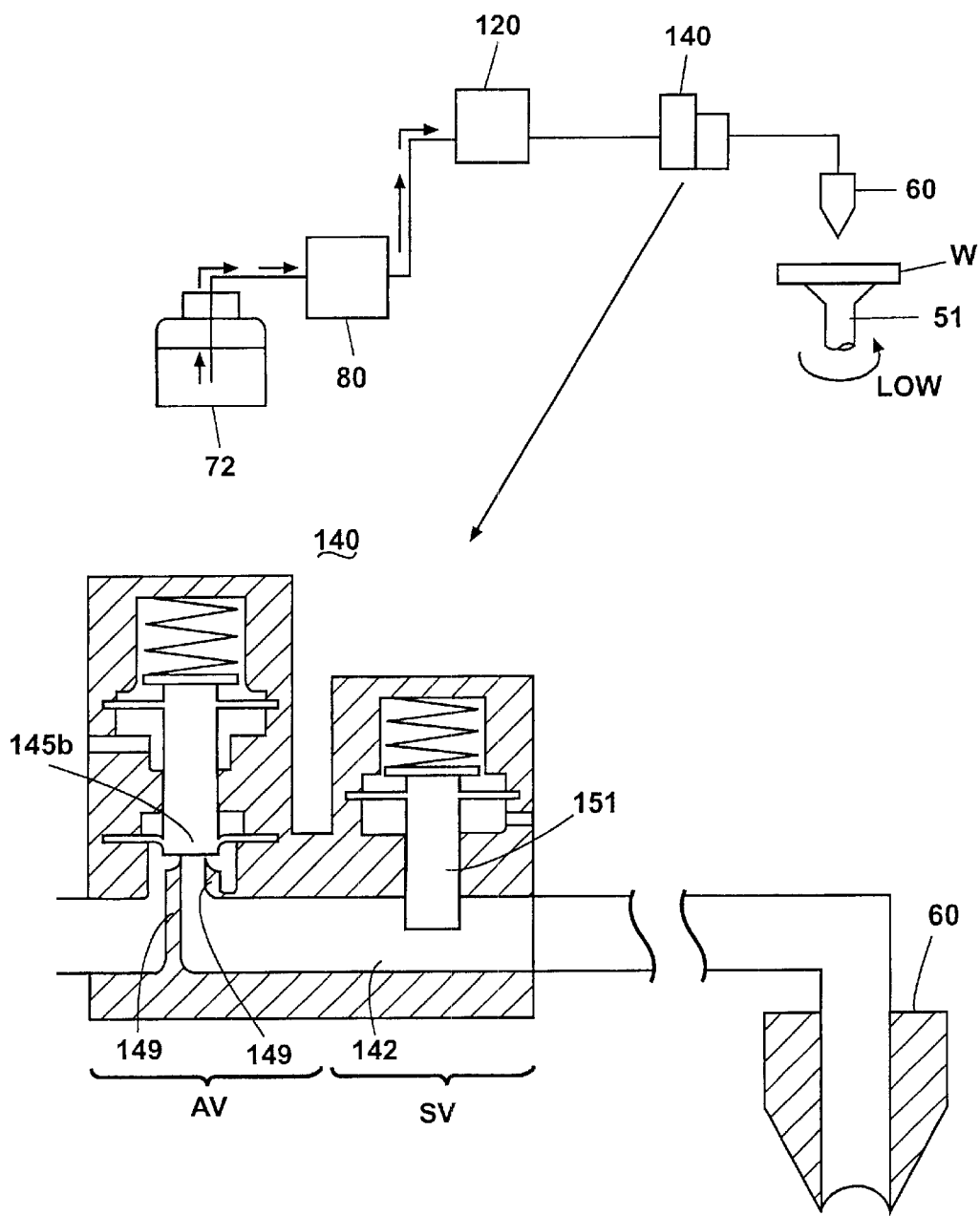
FIG. 17 is a diagram showing schematically the state of the inside of a switching valve, a suck-back valve and a resist nozzle involving the embodiment of the present invention.

FIG. 16 is a diagram showing the timing charts of the respective movements of the supplying pump 80, the discharging pump 120, the switching valve AV, and the suck-back valve SV, and FIG. 17 is a diagram showing schematically the respective states, preceding the discharge of the resist liquid from the resist nozzle 60 and during sucking movement of the discharging pump 120, of the insides of the switching valve AV, the suck-back valve SV and the resist nozzle 60.

In the chart P1, the pressure P1 of the discharging pump 120 is negative between the time $t_1$ to $t_4$, this means the sucking movement. The drive of the discharging pump 120 is started at the time $t_1$ and accelerated up to time $t_2$ to be the prescribed sucking speed. Thereafter, the sucking is carried out with a constant speed up to time $t_3$ and is decelerated from time $t_3$ to stop the movement at the time $t_4$. With respect to the sucking movement of the discharging pump 120 during the time $t_1$ to $t_4$, the supplying pump 80 is made to carry out the discharge movement as that shown in the chart of P2. That is, the drive of the supplying pump 80 is started at the time $t_1$ and accelerated up to time $t_2$ to be the prescribed sucking speed. Thereafter, the discharge is carried out with a constant speed up to the time $t_3$ and, then, decelerated from the time $t_3$ to stop at the time $t_4$. The above described movements of the supplying pump 80 are carried out by controlling the pressure of the compressed air being sent to the supplying pump 80 from the electric-air regulator ER3.

FIG. 17 is a diagram showing schematically the movements during time $t_1$ to $t4$.

During the times $t_1$ and $t_4$, as shown in FIG. 16, only the supplying pump 80 and the discharging pump operate to carry out the sucking movement, neither the switching valve AV nor the suck-back valve SV operates. That is, as shown in FIG. 17, the valve body 145b and the gate portion 149 are closed therebetween, further, the rod 151 of the suck-back valve SV is held protruded to the side of the flowing course 142. In this state, the liquid surface of the resist liquid at the tip end of the resist nozzle 60 is in a stable state dented upward in the figure, accordingly the resist liquid does not drip from the tip end of the resist nozzle 60.

Next, after the time passed $t_4$, from a little bit this side of $t_5$, together with the start of the rotation of the spin chuck 51, the discharging movement of the discharging pump 120 is made to start. At this time, the pressure on the discharging side of the discharging pump 120 is being detected by the pressure sensor 123 and observed by the controller 180 together with the number of revolution of the spin chuck 551. And the drive of the discharging pump 120 is controlled so that the pressure on the discharging side becomes the prescribed value at the time $t_5$ where the number of revolution of the spin chuck 51 becomes the prescribed number of revolution (the maximum value).

At a point of time when the time is $t_5$ and the speed of revolution of the spin chuck 51 is the maximum, the resist liquid is discharged on the wafer W from the resist nozzle 60.

Figure 18:
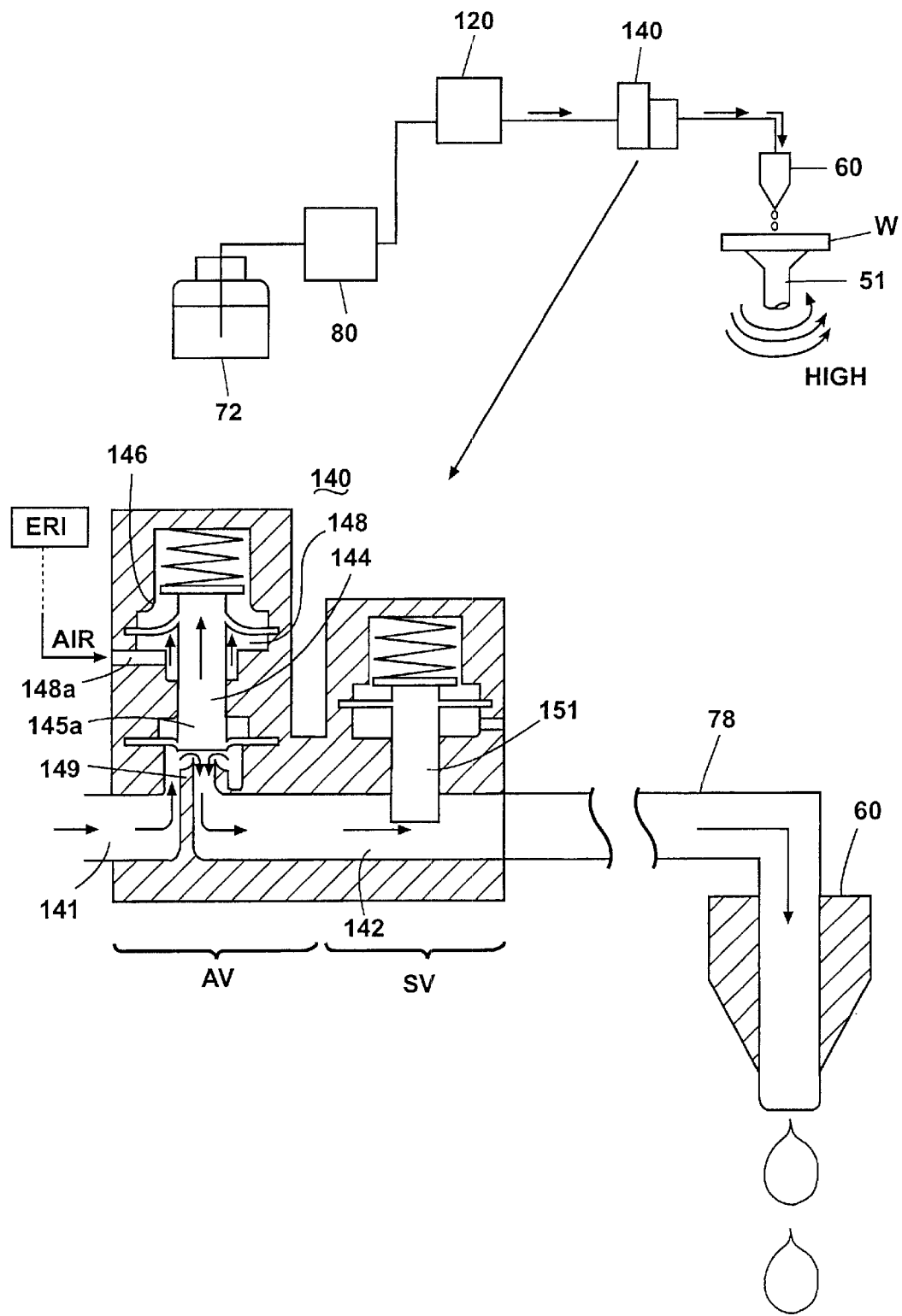
FIG. 18 is a diagram showing schematically the state of the inside of a switching valve, a suck-back valve and a resist nozzle involving the embodiment of the present invention.

FIG. 18 is a diagram showing schematically the state where the switching valve AV is opened and the resist liquid is discharged from the resist nozzle 60 onto the wafer W revolving with high speed.

To open the switching valve AV, the electric signals are sent from the controller 180 to the electric-air regulator ER1 disposed in the neighborhood of the switching valve AV between the operation port 148a of the switching valve AV and an air compressor (not shown in the figure).

When the electric-air regulator ER1, upon reception of the electric signals, sends immediately the compressed air of the predetermined pressure into the air room 148, the compressed air make deform the diaphragm 146 to lift up the rod 144 as well as the valve body 145b upward in the figure, and make form a space between the valve body 145b and the gate portion 149, thereby make communicate between the flowing course 141 on the sucking side and the flowing course 142 on the discharge side. Since, to the flowing course 141 on the suck side, the resist liquid from the discharging pump 120 is sent pressurized, the resist liquid flows into the flowing course 142 on the discharge side by passing through the gap between the valve body 145b and the gate portion 149, and is dripped onto the wafer W through the flowing course 78 and the resist nozzle 60. Incidentally, even during this, the rod 151 of the suck-back valve SV is kept protruded to the flowing course 142 side.

Next, at the time $t_6$, the movement of discharge of the discharging pump 120 is ceased, and at the same time, the switching valve AV is closed.

As shown in the chart of P1 in FIG. 16, contrary to the movement of discharge of the discharging pump 120 being ceased instantaneously at the time $t_6$, the closure of the switching valve AV is carried out with a slow speed over the time $t_6$ to $t_7$. The reason why the closing speed of the switching valve AV is made such a slow speed is to prevent the resist liquid from forming particles by dripping from the resist nozzle 60.

Such a control of the closing speed of the switching valve AV is carried out by reducing gradually, for instance, from 5 kg/cm$^2$ to 3 kg/cm$^2$ in several tens millisecond, the pressure of the compressed air outputted to the flowing course on the outputting side thereof by controlling the electric-air regulator ER1 linked to the air room 148 of the switching valve AV.

Figure 19:
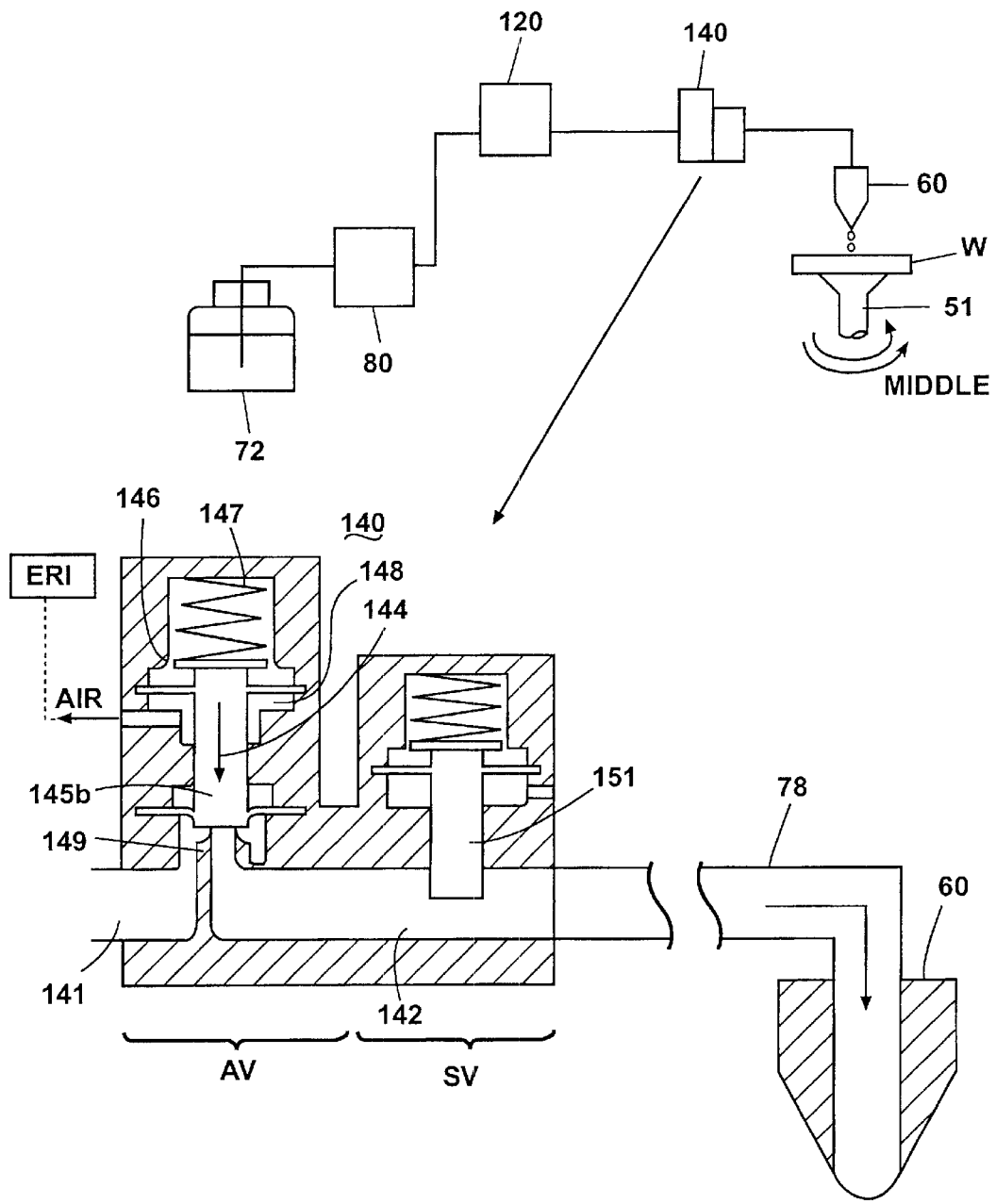
FIG. 19 is a diagram showing schematically the state of the inside of a switching valve, a suck-back valve and a resist nozzle involving the embodiment of the present invention.

FIG. 19 is a diagram showing schematically the state of the inside immediately after the discharging pump 120 is stopped.

After the predetermined amount of the resist liquid is discharged during the time $t_5$ to $t_6$, when the pressure of the compressed air sent to the air room 148 through the electric-air regulator ER1 goes down, due to the pressing force of the spring 147, the rod 144 and the valve body 145b therebelow make contact with the gate portion 149, thereby the flowing course 141 on the sucking side and the flowing course 142 on the discharging side are closed therebetween. As a result, at the tip end of the resist nozzle 60, the dripping of the resist liquid stops roughly, however, the flowing course 78 from the gate portion 149 to the tip end of the resist nozzle 60 is filled by the resist liquid. Therefore, as shown in FIG. 19, the liquid surface at the tip end of the resist nozzle 60 becomes protruded in convex downward in the figure due to the weight of the resist liquid.

Further, when the time is $t_8$ only a little time passed after $t_7$, the suck-back valve SV is started to operate.

Figure 20:
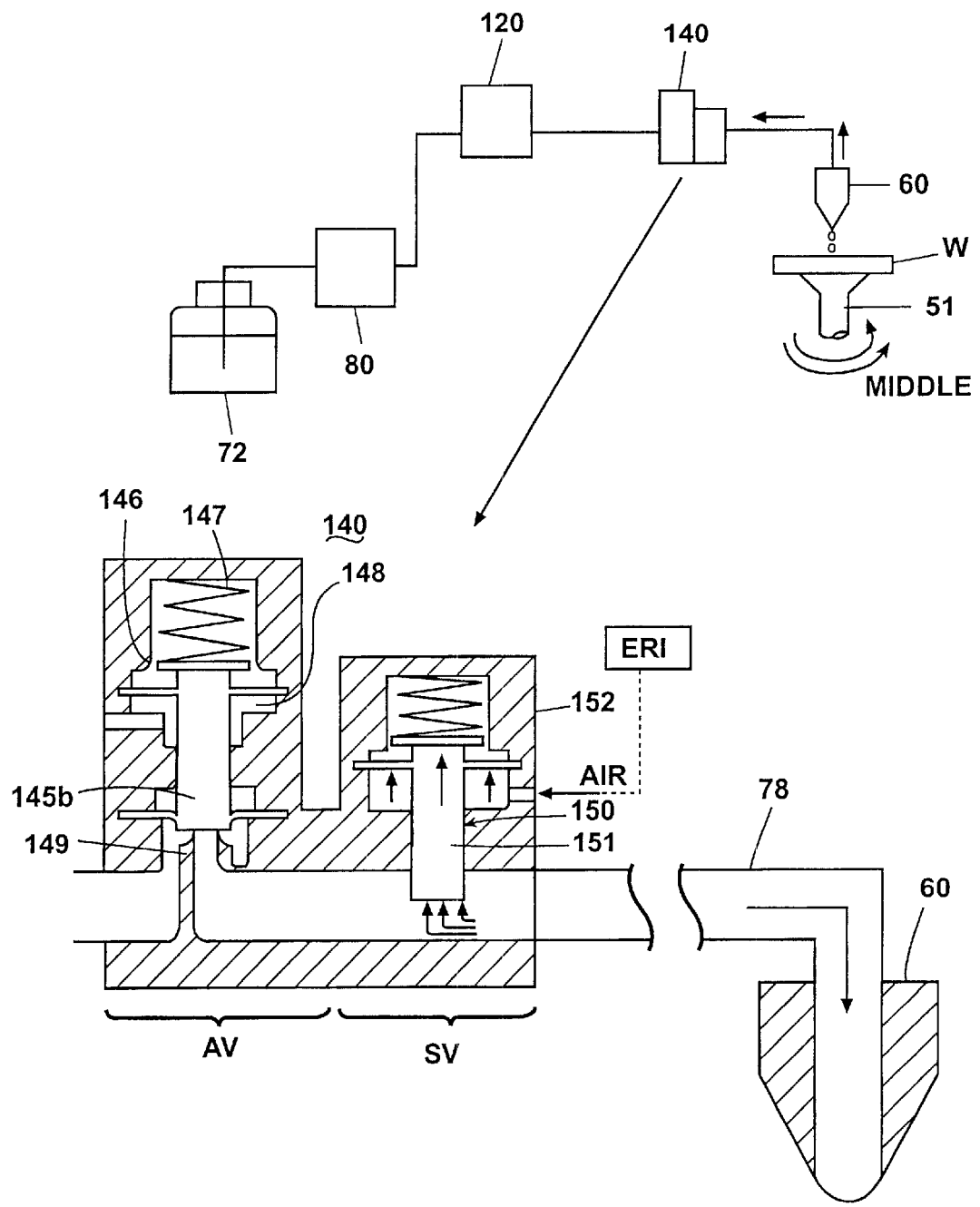
FIG. 20 is a diagram showing schematically the state of the inside of a switching valve, a suck-back valve and a resist nozzle involving the embodiment of the present invention.

FIG. 20 is a diagram showing schematically the respective inside states of the switching valve AV, the suck-back valve SV and the resist nozzle 60 at the time $t_8$.

When the time is $t_8$ upon passing the predetermined minute time after the closure of the switching valve AV, the compressed air is sent into the air room 155 through the electric-air regulator ER2. The compressed air deforms the diaphragm 152 to lift the rod 151 upward in the figure. When, accompanying this, the lower end portion of the rod 151 is sucked upward in the figure into the cylinder 150, the volume inside of the flowing course 78 from the gate portion 149 to the resist nozzle 60 increases to add the negative pressure on the resist liquid held in the flowing course 78.

Since the gate portion 149 of the switching valve AV and the valve body 145b are closed therebetween, the negative pressure acts on the liquid surface of the tip end of the resist nozzle 60 and sucks the liquid surface into the inside of the resist nozzle 60, resulting in a state dented upward in the figure as shown in FIG. 16.

Thus, in the resist coating unit (COT) involving the present embodiment, as a speed controller for controlling the switching speed of the switching valve AV or the suck-back valve SV, the electric-air regulators ER1 and ER2 of small size and high response speed are employed and disposed in the neighborhood of the respective valves, thereby the total flowing course can be made short, accordingly the time lag up to action of the respective valves can be made as short as possible.

Further, in the resist coating unit (COT) of the present embodiment, together with the adoption of the electric-air regulators ER1 and ER2 which show hardly the time lag up to the action and can control the switching speed of the valve freely variable and with high accuracy, the action of the each device of the discharging pump 120, the switching valve AV, and the suck-back valve SV is controlled through the controller 180 by monitoring the pressure of the resist liquid discharged from the discharging pump 120 by the pressure sensor 123. Therefore, these discharging pump 120, the switching valve AV, and the suck-back valve SV can be operated with the best timings, accordingly, the generation of the particles due to dripping of the resist liquid at the tip end of the resist nozzle 60 can be prevented from occurring.

Further, the resist coating unit of the present embodiment comprises an exclusive controller 170 for controlling the timings of action of the switching valve AV and the suck-back valve SV. Therefore, without being perplexed by the noise signals, the switching valve AV and the suck-back valve SV can be operated accurately with the best timings.

Further, in the resist coating unit of the present embodiment, whereas the pressure of the resist liquid discharged from the discharging pump 120 is being monitored by the pressure sensor 123, by disposing the electric-air regulator ER3 on the air room 83 side of the supplying pump 80, the discharging pump 120 and the supplying pump 80 are operated associated. Thereby, the fluctuation of the pressure acting on the resist liquid in the flowing course is prevented from occurring, resulting in prevention of the deterioration of the resist liquid.

In addition, since the buffer tank can be omitted and the number of the liquid level sensor can be reduced, the chance of the resist liquid meeting the air decreases to be capable of preventing the deterioration of the resist liquid from occurring, at the same time, because of unnecessariness of the buffer tank and the liquid level sensor, the cost can be reduced.

Further, since there is disposed a check-valve 89 of slow leak type which flows always a little coating liquid to the upstream side of the supplying pump 80, the fluctuation of the pressure acting on the resist liquid can be prevented from occurring. Thereby, the deterioration of the resist liquid can be firmly prevented from occurring.

Further, as mentioned above, by use of the bellows pump 120 of tubephragm type which incorporates the filter 129, generation of bubbles can be prevented from occurring. Therefore, together with the effects of the switching valve AV, the suck-back valve SV, and the aforementioned pump 120, the generation of bubbles can be prevented from occurring more firmly, the wrong film thickness does not tend to occur, resulting in an effect of improving the yield.

Incidentally, the present invention is not restricted to the aforementioned embodiments.

For instance, in the aforementioned embodiments, as the speed controller of the switching valve or the suck-back valve, a valve equipped with an electric-air regulator ER is employed. However, it may be one that is a driving source driven electrically and can almost ignore the time lag, for instance, a valve carrying out switching operation by use of a servomotor or solenoid valve can be used.

Further, as the discharging pump 120, a pump incorporated a filter 129 is employed, however, a pump which is known well hitherto and does not incorporate the filter can be employed.

Figure 21:
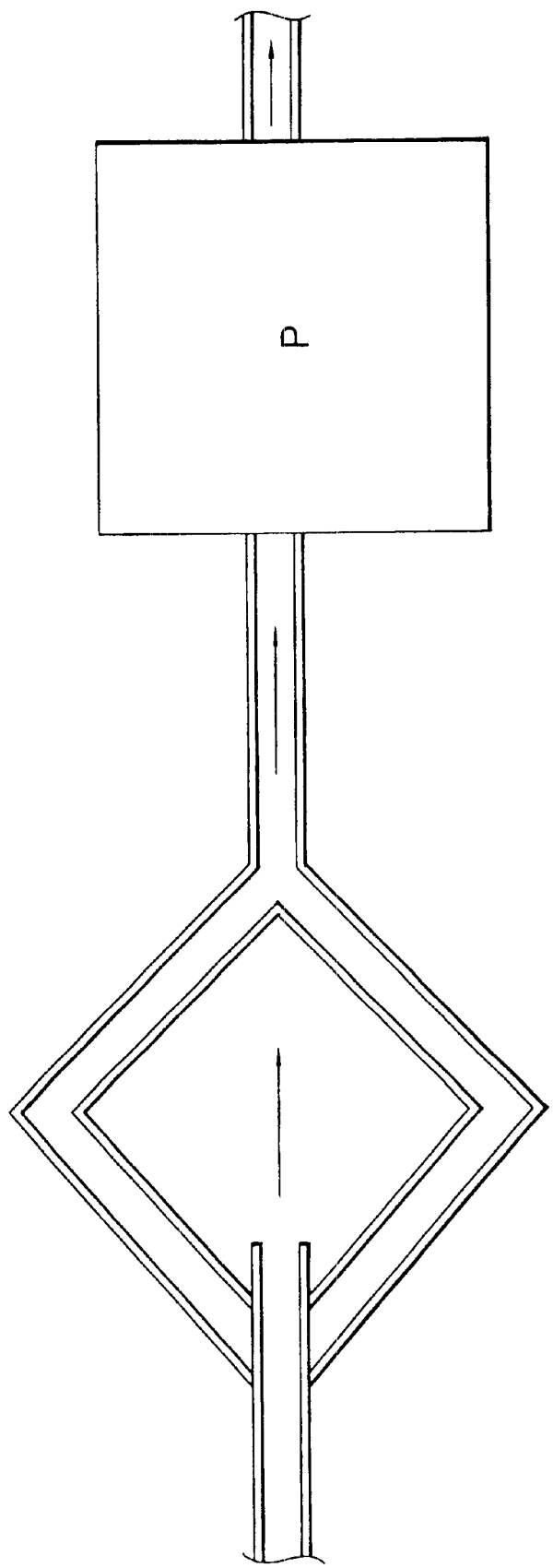
FIG. 21 is a diagram showing a state in which a discharging pump and a filter, constituted independently each other, are connected by a conduit.
Figure 22:
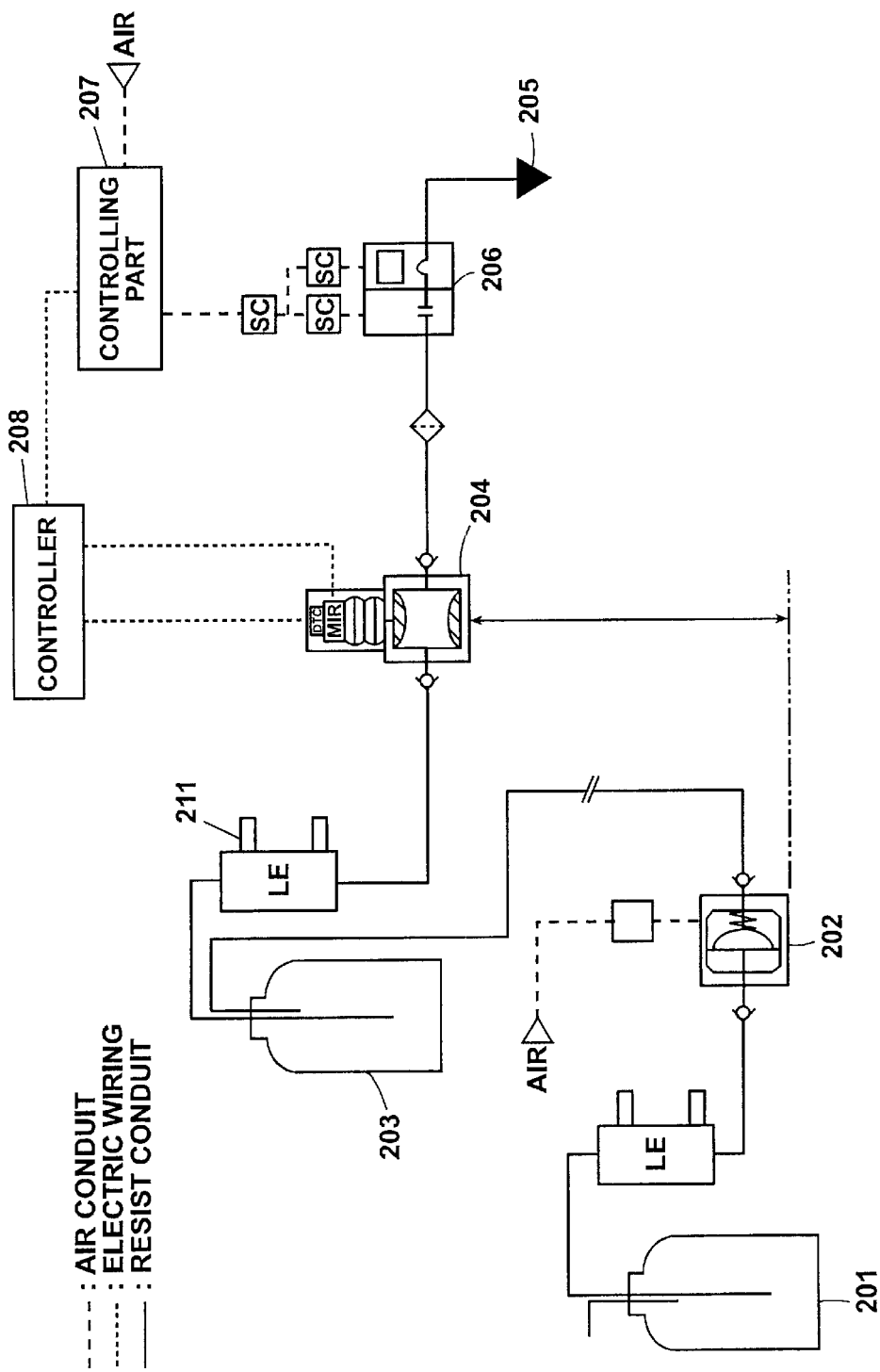
FIG. 22 is a diagram showing diagrammatically a constitution of the conventional resist liquid supplying system.

Further, as shown in FIG. 21, a discharging pump 120 and a filter 129 each of which is constituted independently can be used by connecting therebetween by a conduit.

Further, in the present embodiment, the case in which the present invention is applied to the resist coating apparatus was described, however, the present invention can be applied to a coating apparatus for coating other coating liquid on the wafer such as an apparatus for forming an antireflection coating on the wafer.

Further, the present invention can be also applied to an apparatus which coats the resist liquid and other treatment liquid on the substrate other than the semiconductor wafer, for instance, an LCD substrate.

As described above in detail, according to the coating apparatus of the present invention, since, as a means for controlling the switching speed of the valve, a speed controlling means which controls electrically is employed, the time lag up to the action of the valve can be made as short as possible.

In the aforementioned coating apparatus, if, as the valve, one that is constituted of a switching valve and a suck-back valve is employed and a control portion for controlling exclusively the actions of the switching valve and the suck-back valve is further disposed, the switching valve and the suck-back valve can be operated with the best timing.

Further, if, by disposing a pressure detecting means to the discharging pump, the action of the aforementioned valve is controlled based on the pressure, detected by the aforementioned detecting means, of the coating liquid on the downstream side of the discharging pump, the discharging pump and the valve can be operated with the best timing.

If, by disposing the pressure detecting means to the supplying pump, the pressure of the supplying pump is controlled based on the action of the discharging pump, the buffer tank or the liquid level sensor are made unnecessary between the supplying pump and the discharging pump, thereby the cost can be reduced. Further, since the pressure of the supplying pump can be controlled with high accuracy by the pressure controlling means, the resist liquid can be prevented from deteriorating due to careless fluctuation of the pressure acting on the resist liquid.

Further, if the aforementioned coating apparatus is further equipped with a slow leak valve flowing always a very little amount of the coating liquid to the upstream side of the supplying pump, the fluctuation of the pressure acting on the resist liquid can be prevented from occurring, thereby, the resist liquid is more firmly prevented from deteriorating.

Further, if the pressure of the aforementioned supplying pump and the action of the valves are made to be controlled based on the action of the discharging pump, the buffer tank and the liquid level sensor are made unnecessary between the supplying pump and the discharging pump, thereby the cost can be reduced. Further, since the pressure of the supplying pump is being controlled with high accuracy by the pressure controlling means, the careless fluctuation of the pressure acting on the resist liquid is prevented from occurring, thereby the resist liquid is prevented from deteriorating.

Further, in the aforementioned coating apparatus, a pressure detecting means is disposed to the discharging pump, and a pressure controlling means for controlling the pressure of the coating liquid on the downstream side of the pump is disposed to the supplying pump. Based on the pressure of the downstream side of the discharging pump detected by the pressure detecting means, if the actions of the discharging pump and the valves are made to be controlled, at the same time, if the pressure of the supplying pump is controlled based on the action of the discharging pump, the discharging pump and the valves can be operated at the best timing with high accuracy.

What is claimed is:

1. A coating apparatus, which comprises:
   a nozzle that discharges a coating liquid to an object to be treated;
   a container that accommodates the coating liquid;
   a discharge pump, said pump disposed between the nozzle and the container, that sends the coating liquid in the container to the nozzle;
   a valve disposed between the discharge pump and the nozzle and provided with a speed control device capable of controlling electrically a switching speed;
   a controller device that controls the operation of the discharge pump; and
   a pressure detector that detects pressure of the coating liquid on the downstream side of the discharge pump;
   wherein the controller device is a device which further controls the operation of the valve based on the detected pressure of the coating liquid, and
   wherein the valve comprises a switching valve and a suck-back valve, and further comprises valve controller that exclusively controls the operation of the switching valve and the suck-back valve.

2. A coating apparatus, which comprises:
   a nozzle that discharges a coating liquid to an object to be treated;
   a container that accommodates the coating liquid;
   a discharge pump, said pump disposed between the nozzle and the container, that sends the coating liquid in the container to the nozzle;
   a valve disposed between the discharge pump and the nozzle and provided with a speed controller that controls electrically a switching speed;
   a controller device that controls the operation of the discharge pump;
   a supply pump that supplies the coating liquid in the container to the discharge pump, the supply pump being disposed between the container and the discharge pump; and
   a pressure controller that controls the pressure of the coating liquid on the downstream side of the supply pump, the pressure control device being disposed between the container and the discharge pump;
   wherein the controller device is a device which further controls the pressure of the supply pump based on the actions of the discharge pump, and
   wherein the valve comprises a switching valve and a suck-back valve, and further comprises a valve controller that exclusively controls the operation of the switching valve and the suck-back valve.

3. The coating apparatus as set forth in claim 2:
   wherein the controller device is a device which further controls the pressure of the supply pump and the operation of the valve based on the actions of the discharge pump.

4. The coating apparatus as set forth in claim 3, which further comprises:
   a slow leak valve that allows a little amount of the coating liquid to flow to an upstream side of the supply pump even when the slow leak valve is closed.

5. A coating apparatus, which comprises:
   a nozzle that discharges a coating liquid to an object to be treated;
   a container that accommodates the coating liquid;
   a discharge pump, said pump disposed between the nozzle and the container, that sends the coating liquid in the container to the nozzle;
   a valve disposed between the discharge pump and the nozzle and provided with a speed control device which controls electrically a switching speed;
   a controller device that controls the operation of the discharge pump;
   a pressure detector that detects the pressure of the coating liquid on the downstream side of the discharge pump;
   a supply pump which is disposed between the container and the discharge pump; and
   a pressure controller that controls the pressure of the coating liquid on the downstream side of the supply pump;
   wherein the controller device controls the operations of the discharge pump and the valve based on the pressure detected by the pressure detector, and at the same time, controls the pressure of the supply pump based on the actions of the discharge pump, and
   wherein the valve comprises a switching valve and a suck-back valve, and further comprises a valve controller that exclusively controls the operation of the switching valve and the suck-back valve.

* * * * *

UNITED STATES PATENT AND TRADEMARK OFFICE
CERTIFICATE OF CORRECTION

PATENT NO. : 6,391,111 B1
DATED : May 21, 2002
INVENTOR(S) : Fujimoto et al.

It is certified that error appears in the above-identified patent and that said Letters Patent is hereby corrected as shown below:

Column 20,
Line 5, please replace "a pressure controller" to -- a pressure control device --.

Signed and Sealed this

Twenty-eighth Day of October, 2003

JAMES E. ROGAN
*Director of the United States Patent and Trademark Office*